(12) United States Patent
Kim

(10) Patent No.: US 9,997,586 B2
(45) Date of Patent: Jun. 12, 2018

(54) ELECTRO-LUMINESCENCE DISPLAY APPARATUS

(71) Applicant: LG DISPLAY CO., LTD., Seoul (KR)

(72) Inventor: JungMook Kim, Jeonju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 5 days.

(21) Appl. No.: 15/336,523

(22) Filed: Oct. 27, 2016

(65) Prior Publication Data

US 2017/0125506 A1   May 4, 2017

(30) Foreign Application Priority Data

Oct. 30, 2015   (KR) ........................ 10-2015-0151829

(51) Int. Cl.
*H01L 27/32*   (2006.01)
*H01L 51/52*   (2006.01)
*H01L 27/12*   (2006.01)

(52) U.S. Cl.
CPC ...... *H01L 27/3276* (2013.01); *H01L 27/3213* (2013.01); *H01L 27/3258* (2013.01); *H01L 27/3265* (2013.01); *H01L 27/3272* (2013.01); *H01L 51/5212* (2013.01); *H01L 27/124* (2013.01); *H01L 27/1248* (2013.01); *H01L 27/1255* (2013.01); *H01L 2251/5315* (2013.01)

(58) Field of Classification Search
CPC ............. H01L 25/0753; H01L 27/0207; H01L 27/11807; H01L 27/115; H01L 27/105; H01L 33/62; H01L 33/20
See application file for complete search history.

(56) References Cited

U.S. PATENT DOCUMENTS

| | | | |
|---|---|---|---|
| 8,477,252 B2 * | 7/2013 | Watanabe | ............. G02F 1/1345 349/139 |
| 2005/0134783 A1 | 6/2005 | Park et al. | |
| 2007/0263166 A1 | 11/2007 | Ahn et al. | |
| 2009/0141202 A1 | 6/2009 | Yoshida | |
| 2010/0033664 A1 | 2/2010 | Lee | |
| 2014/0264357 A1 | 9/2014 | Chen et al. | |

* cited by examiner

*Primary Examiner* — Quoc Hoang
(74) *Attorney, Agent, or Firm* — Dentons US LLP

(57) ABSTRACT

Described herein is an electroluminescence display apparatus comprising: at least one quad-type pixel circuit unit comprising a plurality of sub-pixel circuit units; at least one gate line disposed between the plurality of sub-pixel circuit units and extending along a first direction; at least one first data line group comprising a first pair of data lines disposed at both sides of the at least one pixel circuit unit and extending along a second direction; at least one second data line group comprising a second pair of data lines disposed between the sub-pixel circuit units and extending along the second direction; and at least one common line and at least one anode line disposed between the first pair of data lines of the first data line group and disposed along the first direction, the at least one gate line crosses with the at least one first data line group and the at least one second data line group.

36 Claims, 23 Drawing Sheets

ELECTRO-LUMINESCENCE DISPLAY APPARATUS

CROSS REFERENCE TO RELATED APPLICATIONS

This application claims the benefit of Korean Patent Application No. 10-2015-0151829 filed on Oct. 30, 2015, which is hereby incorporated by reference as if fully set forth herein.

BACKGROUND

Technical Field

The present disclosure relates to a top-emission type electro-luminescence display apparatus capable of improving uniformity of brightness of the electro-luminescence display apparatus by reducing a degree of deviation of electric potential between anode and cathode according to the location of the respective pixels within the pixel area of the electro-luminescence display apparatus. The electro-luminescence display apparatus of the present disclosure is also capable of improving uniformity of electric potential when the electro-luminescence display apparatus is enlarged.

Discussion on the Related Art

An organic light emitting display apparatus, which is a self-luminous display device, does not require a separate or an additional light source, such as a liquid crystal display apparatus, and is therefore made in a light weight and thin form. In addition, the organic light emitting display apparatus is not only advantageous in terms of low power consumption due to its low driving voltage, but is also advantageous in terms of fast response speed, wide viewing angle and infinite contrast ratio.

The pixel area of an organic light emitting display apparatus includes a plurality of sub-pixels. Each of the sub-pixels includes an organic light emitting diode (OLED). Each of the organic light emitting diodes includes an anode which is a pixel electrode, an organic emission layer and a cathode which is a common electrode. An anode voltage ELVDD is supplied to the pixel electrode through a driving transistor and a cathode voltage ELVSS is supplied to the common electrode.

In a top-emission type organic light emitting display apparatus, reliability is required to protect the organic emission layer from, for example, oxygen and moisture. Thus, an encapsulation unit is formed to protect the organic emission layer from oxygen, moisture, physical shock and/or debris that may occur during a manufacturing process. The encapsulation unit may be chosen from a glass encapsulation unit, a transparent encapsulation unit in which an inorganic layer and an organic layer are alternatively stacked, or a dam and fill type transparent encapsulation unit in which an inorganic layer covers the organic light emitting diode on the first substrate, a transparent resin fills the area between the first substrate and the second substrate and a dam surrounds the transparent resin.

Further, in a top-emission type organic light emitting display apparatus, a semi-transparent (translucent) common electrode is a magnesium-silver (Mg:Ag) electrode, ytterbium (Yb) electrode and/or alloy thereof for releasing the emitted light at the organic emission layer toward the top side. To obtain the semi-transparent characteristic, the thickness of the common electrode can be very thin, for example, between 200 Å to 300 Å. However, in general, a reduction in thickness increases electrical resistance of the common electrode.

In a large sized top-emission type organic light emitting display apparatus, the electrical resistance of the common electrode tends to be high. Thus, a non-uniform brightness problem may arise if the distance from the cathode voltage supply unit, which can supply a cathode voltage ELVSS to the common electrode, increases.

SUMMARY

The inventor of the present disclosure has conducted research and development on an electro-luminescence display apparatus (e.g., self-emissive display apparatus such as organic light emitting display apparatus and/or quantum-dot light emitting display apparatus), comprising a cathode line (i.e., an auxiliary common line) to improve uniformity of a cathode voltage according to positions of the pixels within the pixel area AA of the electro-luminescence display apparatus, which is capable of reducing differences of electrical resistance of the common electrode according to the position of the active area AA. However, if an auxiliary common line is implemented, this may cause the following exemplary problems that need to be solved.

Firstly, if the width and the thickness of the common line are reduced, the line resistance increases, thereby decreasing the performance of the common line. On the other hand, if the width and the thickness of the common line are increased, the area for circuit elements (for example, a storage capacitor, a switching element and a driving element) that operate the sub-pixel may be reduced, and this may cause further problems.

For example, if the line resistance of the common line increases, the uniformity of the cathode voltage of the electro-luminescence display apparatus is degraded, thereby increasing the degree of unevenness in terms of the brightness of the electro-luminescence display apparatus. Furthermore, if the line resistance of the common line increases, the degree of heat generated at the common line also increases, thereby increasing thermal stress, which is undesirable.

Alternatively, if the line resistance of the common line decreases, the uniformity of the cathode voltage of the electro-luminescence display apparatus can be improved. However, if the area for the common line increases, then the area for the storage capacitor decreases. Accordingly, the capacitance of the storage capacitor may decrease and a voltage level supplied to the sub-pixel of the electro-luminescence display apparatus may increase, thereby increasing power consumption and temperature, or decreasing the brightness of the electro-luminescence display apparatus because of insufficient charging of an image signal at the sub-pixel.

Further, if the area of the common line increases, the area of the channel of the driving transistor decreases. Thus, the current driving ability of the driving transistor may also decrease such that the voltage level of an image signal of the electro-luminescence display apparatus increases.

Accordingly, if the above-described problems are present it may be difficult to increase the degree of integration of the sub-pixel, thereby making it difficult to realize an electro-luminescence display apparatus having a high degree of integration and high resolution. For example, an approximately 55 inch display apparatus may have a problem with realizing a resolution higher than 80 pixels per inches (ppi), such as in a 4K ultra high definition display apparatus.

Secondly, when the common line is connected to the common electrode, an electro-luminescence layer (e.g., organic emission layer or quantum-dot emission layer) disposed between the common line and the common electrode has an insulation layer characteristic. Thus, an electro-luminescence layer should not exist at the common line contact unit configured to connect the common electrode and the electro-luminescence layer. However, there are manufacturing limits and/or difficulties associated with interconnecting the common line and the common electrode, because the electro-luminescence layer such as the organic emission layer can be easily damaged by oxygen, moisture, hydrogen, etchant or high temperature. Further, a certain area is required for configuring the common line contact unit and the common electrode. Thus, it may be difficult to realize a high resolution electro-luminescence display apparatus depending on the configuration of the contact unit.

Thirdly, the common line can be configured such that a plurality of lines is disposed in the pixel area AA and spaced apart from each other with a certain distance. In such case, due to the limitations of the manufacturing process (e.g., photolithography process or etching process), there may be a variation in the thickness and width of each line. Accordingly, a uniformity of the brightness of the pixel area AA may degrade unless the line resistance variation is reduced.

Fourthly, the electro-luminescence display apparatus may further include an additional metal layer to form the common line. However, in such a case, the manufacturing process becomes more complicated and the manufacturing cost may also increase. On the other hand, if the common line is formed without the additional metal layer, the difficult in designing the high resolution electro-luminescence display apparatus may increase because of the area of the common line. Particularly, it may be difficult to optimize the layout of various lines to increase the resolution of the high resolution electro-luminescence display apparatus.

Fifthly, a cathode voltage supply unit may be configured to surround non-pixel areas (periphery area) to suppress an increase of the cathode voltage level. However, in such a case, the width of the bezel of the electro-luminescence display apparatus may increase.

To address the above-discussed exemplary disadvantages, an exemplary aspect of the present disclosure is to provide a high resolution electro-luminescence display apparatus including a common line (i.e., auxiliary line) capable of sufficiently reducing the line resistance of the common electrode.

Another exemplary aspect of the present disclosure is to provide a high resolution electro-luminescence display apparatus including a contact unit of an auxiliary line capable of reducing the area of the common line contact unit configured to connect the common electrode (i.e., cathode).

Accordingly, yet another exemplary aspect of the present disclosure is to provide a high resolution electro-luminescence display apparatus including an auxiliary line capable of realizing a narrow bezel and reducing the degree of non-uniformity of brightness (or improving the brightness uniformity) due to the line resistance variation between a plurality of common lines.

Accordingly, yet another exemplary aspect of the present disclosure is to provide a high resolution organic light apparatus capable of optimizing a layout that comprises at least common lines, anode lines, gate lines and date lines within the pixel area AA.

An exemplary aspect of the present disclosure provides an electro-luminescence display apparatus comprising: a pixel circuit unit comprising quad-type sub-pixel circuit unit; a first data line group comprising a pair of data lines disposed at both sides of the pixel circuit unit and extended to a second direction; a second data line group comprising another pair of data lines disposed between the sub-pixel circuit units and extended to the second direction; a gate line disposed between the sub-pixel circuit units and extended to a first direction crossing the first data line group and the second data line group; and a common line and an anode line alternatively disposed to the first direction and disposed between the pair of data lines of the first data line group.

According to the present disclosure, the uniformity of the brightness of the top-emission type electro-luminescence display apparatus improves based on the optimization of the auxiliary line structure, the anode line structure, the gate line structure and the data line structure.

Moreover, the display apparatus of the present disclosure increases the aperture ratio of the pixel electrode of the pixel area by reducing the area of the common line contact unit and the common electrode.

Furthermore, the display apparatus of the present disclosure improves the uniformity of brightness by reducing the variation of line resistance between the common lines and simultaneously realizing a narrow bezel.

More details of the embodiments of the present disclosure are disclosed in the detailed description and the appended drawings. It should be noted that objects of the present disclosure are not limited to the above-described object and other objects of the present disclosure will be apparent to those skilled in the art from the following descriptions.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PRESENT DISCLOSURE

Figure 1:
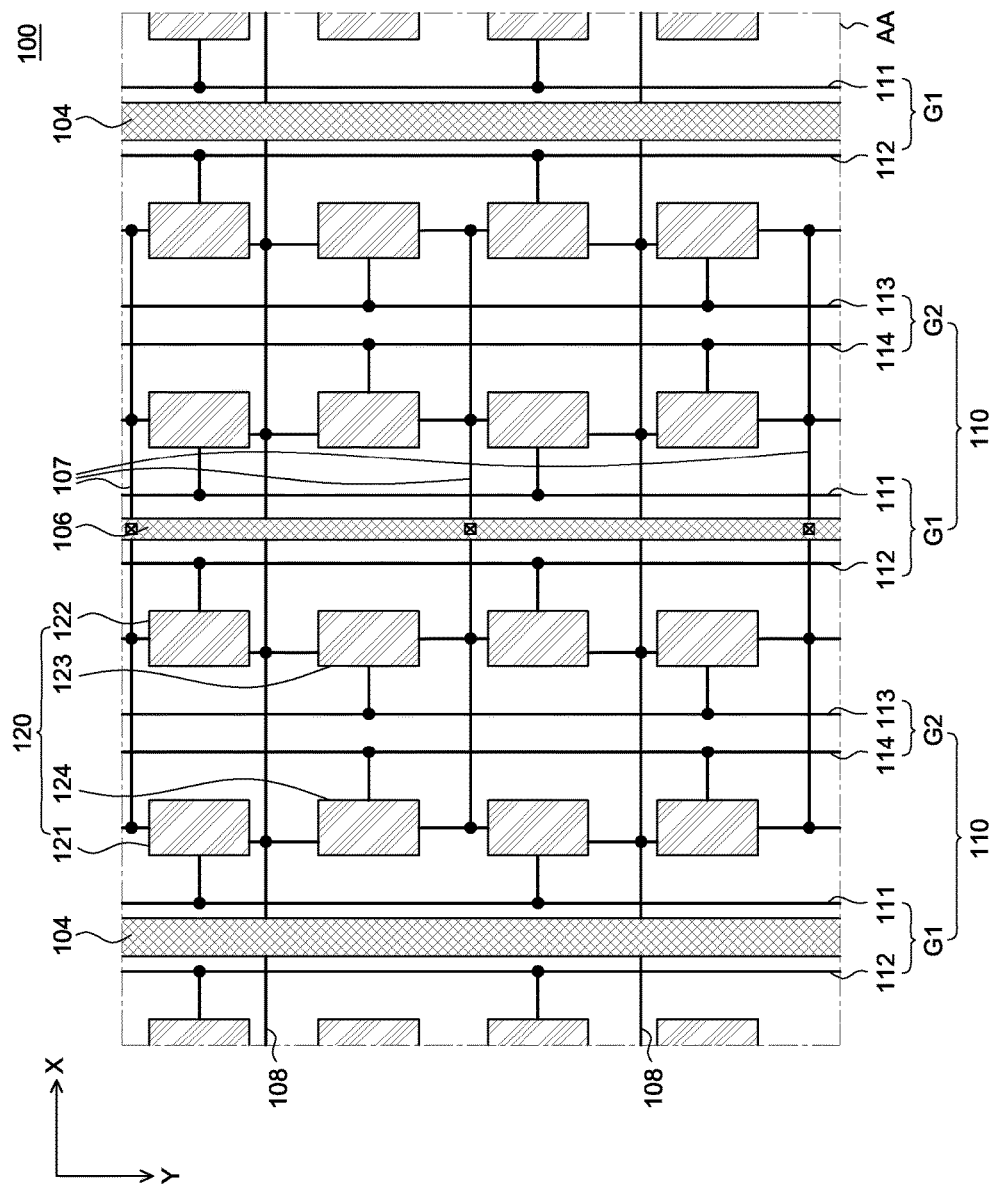
FIG. 1 is a schematic plan view illustrating a circuit configuration of a pixel area of an electro-luminescence display apparatus 100 according to an exemplary embodiment of the present disclosure.

Advantages and features of the present disclosure and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete the present disclosure and to fully provide a person having ordinary skill in the art to which the present disclosure pertains with the category of the invention, and the present invention will be defined by the appended claims.

The shapes, sizes, ratios, angles, numbers and the like illustrated in the accompanying drawings for describing the exemplary embodiments of the present disclosure are merely examples and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. Terms such as "including", "having", "comprising" and "consisting of," and the like, used herein are generally intended to allow other components to be added unless the terms are used with the term "only". Any references to singular may include plural unless expressly stated otherwise.

Components are interpreted to include an ordinary error range or an ordinary tolerance range even if not expressly stated.

When the positional relation between two parts is described using the terms such as "on", "above", "below" and "next", on or more parts may positioned between the two parts unless the terms are used with the term "immediately" or "directly".

Although the terms "first", "second" and the like are used for describing various components, these components are not confined by these terms. These terms are merely used to distinguish one component from other components. Therefore, a first component to be mentioned below may be a second component in a technical concept of the present disclosure.

The size and thickness of each component illustrated in the drawings are represented for convenience of explanation, and the present disclosure is not limited to the illustrated size and thickness of each component.

The features of various embodiments of the present disclosure can be partially or entirely bonded to or combined with each other and can be interlocked and operated in various technical ways as can be fully understood by a person having ordinary skill in the art and the embodiments can be carried out independently of or in association with each other.

An electro-luminescence display apparatus 100 according to an exemplary embodiment of the present disclosure is a top-emission type electro-luminescence display apparatus. FIG. 1 is plan view illustrating a circuit configuration of a pixel area of the electro-luminescence display apparatus 100.

For convenience of explanation, some elements of an electro-luminescence display apparatus such that a common line 104, an anode line 106, a gate line 108, a data line 110 and a pixel circuit unit 120 are illustrated in FIG. 1.

A plurality of pixel circuit units 120 is disposed in pixel area AA on a first substrate 102 (not shown).

For example, the pixel circuit unit 120 may be disposed such as a matrix or an array. In addition, the pixel circuit unit 120 may be referred to a circuit configured to control a sub-pixel comprising a light emitting diode. Hereinafter, the light emitting diode will be deemed as an organic light emitting diode merely for the sake of convenience of description. But the present disclosure is not limited to the organic light emitting diode and may include any self-emissive electro-luminescence element, such as a quantum-dot light emitting diode.

The pixel circuit unit 120 is configured to include a first sub-pixel circuit unit 121, a second sub-pixel circuit unit 122, a third sub-pixel circuit unit 123 and a fourth sub-pixel circuit unit 124. That is, the pixel circuit unit 120 may be referred to as an aggregation of sub-pixel circuit units configured to operate organic light emitting diodes of at least three primary colors.

For example, the first sub-pixel circuit unit 121 may be a circuit unit operating a red sub-pixel; the second sub-pixel circuit unit 122 may be a circuit unit operating a green sub-pixel; the third sub-pixel circuit unit 123 may be a circuit unit operating a blue sub-pixel; and the fourth sub-pixel circuit unit 124 may be a circuit unit operating a white sub-pixel. But the present disclosure is not limited thereto.

The gate line 108 is connected to each of adjacent sub-pixel circuit units 121, 122, 123 and 124.

The data line 110 is configured to include a first data line 111, a second data line 112, a third data line 113 and a fourth data line 114. Further, each of the data lines are configured to be connected to each of corresponding sub-pixel circuit units.

For example, the first data line 111 may be a data line supplying a red image signal to the first sub-pixel circuit unit 121; the second data line 112 may be a data line supplying a green image signal to the second sub-pixel circuit unit 122; the third data line 113 may be a data line supplying a blue image signal to the third sub-pixel circuit unit 123; and the fourth data line 114 may be a data line supplying a white image signal to the fourth sub-pixel circuit unit 124. But the present disclosure is not limited thereto.

Further, the first sub-pixel circuit unit 121 is connected to the first data line 111; the second sub-pixel circuit unit 122 is connected to the second data line 112; the third sub-pixel circuit unit 123 is connected to the third data line 113; and the fourth sub-pixel circuit unit 124 is connected to the fourth data line 114. But the present disclosure is not limited thereto.

The fourth sub-pixel circuit unit 124 may be implemented to readily achieve high display brightness of an electro-luminescence display (e.g., 800 nits or more). Such a high brightness electro-luminescence display apparatus has an advantage of supporting high dynamic ranged (HDR) function.

Each of the sub-pixel circuit units 121, 122, 123 and 124 of the pixel circuit unit 120 is configured to include at least a switching transistor, a driving transistor and a capacitor. The switching transistor is configured to be switched by a scan signal supplied to the gate line 108.

When the switching transistor is switched to an on state, an image signal (i.e., data voltage) supplied through the data line 110 is supplied to an electrode of the capacitor and a gate electrode of the driving transistor, through the switching transistor.

If the image signal is supplied to the driving transistor, the amount of current supplied from the anode line 106 is adjusted by the driving transistor. That is, the resistance value of the channel of the driving transistor is changed according to the supplied image signal. The brightness of the organic light emitting diode can be adjusted according to the adjusted amount of the current that flows through the electro-luminescence element (i.e., organic light emitting diode).

The switching transistor and the driving transistor may be configured as a p-type semiconductor (pMOS), an n-type semiconductor (nMOS) and/or a c-type semiconductor (cMOS). Further, depending on the configuration of p-type and n-type semiconductor, the position of the source electrode and the drain electrode of the transistor may be swapped.

Furthermore, the pixel circuit unit 120 may further include additional configurations such as a threshold voltage variation compensation circuit unit with respect to the driving transistor, an emission period control unit which can switch on/off or control emission duty of the current supplied from the anode line 106 and/or an initial voltage control unit which can discharge the charged data voltage in the capacitor.

In some embodiments, the fourth sub-pixel circuit unit 124 and the fourth data line 114 can be replaced with the second sub-pixel circuit unit 122 and the second data line 112, respectively. In the above-described configuration, a pentile structure disposed with two of the second sub-pixel circuit units 122 can be realized. Such a configuration is advantageous for achieving high brightness because the green organic light emitting diode is as bright as the white organic light emitting diode. Thus, the green organic light emitting diode may replace the white organic light emitting diode.

In some embodiments, a semi-transparent (translucent) common electrode of the organic light emitting diode may be configured as: transparent metal oxide electrode, indium-zinc oxide (IZO) electrode, indium-tin oxide (ITO) electrode, magnesium-silver (Mg:Ag) electrode, ytterbium (Yb) electrode and/or an alloy thereof.

In some embodiments, the organic light emitting diode (OLED) may be substituted by a quantum-dot light emitting diode (QLED). For example, at least one organic emission layer may be substituted by a quantum-dot emission layer, or at least one color filter may be substituted by a quantum-dot color conversion filter, or at least one quantum-dot layer may be an inorganic layer. But the present disclosure is not limited thereto.

In some embodiments, the pixel circuit unit 120 may exclude the fourth sub-pixel circuit unit 124. In such case, the fourth sub-pixel circuit unit 124 may be replaced with a transparent window to realize a see-through display apparatus.

The pixel circuit unit 120, for example, may be a quad-type pixel circuit. The quad-type pixel circuit unit 120 may be an arrangement of four sub-pixels 121, 122, 123 and 124 in which two blocks are disposed along each of a horizontal axis and a vertical axis (e.g., a sub-pixel circuit units with a 2 by 2 matrix arrangement).

For example, the first sub-pixel circuit unit 121 may be positioned at the top-left side of the pixel circuit unit 120; the second sub-pixel circuit unit 122 may be positioned at the top-right side of the pixel circuit unit 120; the third sub-pixel circuit unit 123 may be positioned at the bottom-right side of the pixel circuit unit 120; and the fourth sub-pixel circuit unit 124 may be positioned at the bottom-left side of the pixel circuit unit 120. But the present disclosure is not limited thereto and the position of sub-pixel circuit units 121, 122, 123 and 124 may be rearranged as required.

The area of the channel of the driving transistor of each of the sub-pixel circuit units 121, 122, 123 and 124 can be different from the others depends on the required amount of current flow. For example, the required amount of current of the blue sub-pixel may be higher than the required amount of current of the green sub-pixel. Thus, the area of the channel of the driving transistor of the blue sub-pixel may be larger than area of the channel of the driving transistor of the green sub-pixel. But the present disclosure is not limited thereto and the area of the channel of the driving transistors can be identical to each other.

The area of the capacitor of each of the sub-pixel circuit units 121, 122, 123 and 124 can be different from the others. For example, if the channel area of the driving transistor of the blue sub-pixel circuit unit is larger than the channel area of the driving transistor of the green sub-pixel circuit unit, the area of the capacitor of the blue sub-pixel circuit unit may be smaller than the area of the capacitor of the green sub-pixel circuit unit.

That is, there may be a trade-off relationship such that if an area of one element increases the area of another element decreases. That is, the layout efficiency can be improved by designing the area of each of the sub-pixel circuit units 121, 122, 123 and 124 to be substantially the same and the current driving ability of the driving transistor and the capacitance of the capacitor are adjusted by adjusting the area of the driving transistor and the area of the storage capacitor. But the present disclosure is not limited thereto and it is possible to design the area of the storage capacitor to be identical to each other.

In one aspect of the present disclosure, it is important to optimize the efficiency with respect to an arrangement of the element to realize a high resolution top-emission type of electro-luminescence display apparatus. However, if the elements become too dense, unwanted side effects may occur. Thus, each element should be disposed by considering interrelationship between each element.

In view of the above, a gate line 108 is disposed to intersect with a data line 110 in the pixel area AA of an electro-luminescence display apparatus 100. Hereinafter, the first direction (e.g., X-axis) is referred to the extended direction of the gate line 108, and the second direction (e.g., Y-axis) is referred to the extended direction of the data line 110. But the present disclosure is not limited thereto and the first direction and the second direction are interchangeable.

In addition, for convenience of description, the term "disposed or arranged along the first direction" or "positioned along the first direction" may be construed in reference to the X-axis, and the term "disposed or arranged along the second direction" or "positioned along the second direction" may be construed in reference to the Y-axis direction, as illustrated in FIG. 1. But the present disclosure is not limited thereto.

Two different sub-pixel circuit units of the pixel circuit unit 120 are configured to be alternatively disposed along the second direction. Further, two different sub-pixel circuit units of the pixel circuit unit 120 are configured to be alternatively disposed along the first direction.

For example, the first sub-pixel circuit unit 121 and the fourth sub-pixel circuit unit 124 may be alternatively disposed along the second direction, and the second sub-pixel circuit unit 122 and the third sub-pixel circuit unit 123 may be alternatively disposed along the second direction.

In another exemplary embodiment, the first sub-pixel circuit unit 121 and the second sub-pixel circuit unit 122 may be alternatively disposed along the first direction, and the fourth sub-pixel circuit unit 124 and the third sub-pixel circuit unit 123 may be alternatively disposed along the first direction.

In other words, the sub-pixel circuit units 121 and 122 may be alternatively disposed along the first direction in order of the first sub-pixel circuit unit 121, the second sub-pixel circuit unit 122, the first sub-pixel circuit unit 121 and the second sub-pixel circuit unit 122 or the sub-pixel circuit units 124 and 123 may be alternatively disposed along the first direction in order of the fourth sub-pixel circuit unit 124, the third sub-pixel circuit unit 123, the fourth sub-pixel circuit unit 124 and the third sub-pixel circuit unit 123 in a repeating manner.

The above-described quad-type pixel circuit unit 120 may be disposed such that the pixel circuit unit 120, having a rectangular shape or the like, is sequentially disposed. Thus, it is advantageous to minimize the wasted area even if the pixel circuit units are sequentially disposed along the first and the second direction. Hereinafter, for convenience of description, the pixel circuit unit 120 is regarded as the quad-type pixel circuit unit, and the sub-pixel circuit units of the quad-type pixel circuit unit 120 are disposed as a 2×2 structure. An optimized layout with respect to a plurality of lines or wires within the pixel area AA is further described below.

Data lines 110 are disposed at both sides of a sub-pixel circuit unit which are alternatively disposed along the second direction (e.g., Y-axis), and data lines 111, 112, 113 and 114 are connected to the corresponding sub-pixel circuit units 121, 122, 123 and 124, respectively.

In other words, sub-pixel circuit units in which the sub-pixel circuit units are alternatively disposed along the second direction (e.g., the first sub-pixel circuit unit 121 and the fourth sub-pixel circuit unit 124 or the second sub-pixel circuit unit 122 and the third sub-pixel circuit unit 123) are alternatively disposed along the second direction between a pair of data lines 110. That is, a plurality of mutually different sub-pixel circuit units are configured to be alternatively disposed along the second direction between a pair of mutually different data lines 110 (e.g., between a first data line 111 and a second data line 112).

Respective sub-pixel circuit units are connected to corresponding data lines, and mutually different sub-pixel circuit units may be connected to mutually different sub-pixels configured to display mutually different colors. However, the configuration of the mutually different sub-pixel circuit units may be substantially the same.

If the area of respective sub-pixel circuit units are the same, wasted area can be minimized, and a high resolution top-emission type electro-luminescence display apparatus may be realized, which is another advantageous effect of the present disclosure.

For example, the first data line 111 extends along the second direction and is positioned at one side of the alternatively disposed first sub-pixel circuit unit 121 and fourth sub-pixel circuit unit 124 along the second direction. Further, the fourth data line 114 extends along the second direction and is positioned at the opposite side. Moreover, the third data line 113 extends along the second direction and is positioned at one side of the alternatively disposed second sub-pixel circuit unit 122 and third sub-pixel circuit unit 123 along the second direction. Further, the second data line 112 extends along the second direction and is positioned at the opposite side.

Each first sub-pixel circuit unit 121 is configured to be connected to the corresponding first data line 111 which is disposed at one side; each fourth sub-pixel circuit unit 124 is configured to be connected to the corresponding fourth data line 114 which is disposed at the opposite side; each third sub-pixel circuit unit 123 is configured to be connected to the corresponding third data line 113 which is disposed at one side; and each second sub-pixel circuit unit 122 is configured to be connected to the corresponding second data line 112 which is disposed at the opposite side.

The alternatively disposed and mutually different sub-pixel circuit units along the second direction and a pair of data lines disposed at both sides of said sub-pixel circuit units may be connected to form a zig-zag pattern. In other words, alternatively disposed first sub-pixel circuit unit 121 may be connected to the first data line 111 disposed on the left side and the fourth sub-pixel circuit unit 124 may be connected to the fourth data line 114 disposed on the right side, along the second direction.

Further, a pair of mutually different data lines are alternatively disposed between alternatively disposed sub-pixel circuit units along the first direction (e.g., X-axis).

Some data lines may be disposed as a pair of data lines such that the fourth data line 114 and the third data line 113 are disposed between the alternatively disposed the first sub-pixel circuit unit 121 and the second sub-pixel circuit unit 122 or the fourth sub-pixel circuit unit 124 and the third sub-pixel circuit unit 123 along the first direction and some data lines may be disposed as another pair of data lines such that the second data line 112 and the first data line 111 are disposed between the alternatively disposed the second sub-pixel circuit unit 122 and the first sub-pixel circuit unit 121 or the third sub-pixel circuit unit 123 and the fourth sub-pixel circuit unit 124 along the first direction. Furthermore, these pairs of the data lines are alternatively disposed with such repeating sequence.

A first data line group G1 may be defined as a pair of data lines configured with the second data line 112 and the first data line 111, which are extended along the second direction, spaced apart from each other along the first direction, and disposed between the second sub-pixel circuit unit 122 and the first sub-pixel circuit unit 121.

A second data line group G2 may be defined as a pair of data lines configured with the fourth data line 113 and the third data line 113, which are extended along the second direction, spaced apart from each other along the first direction and disposed between the first sub-pixel circuit unit 121 and the second sub-pixel circuit unit 122.

The first data line group G1 and the second data line group G2 are configured to extend along the second direction and alternatively disposed along the first direction. But the present disclosure is not limited thereto and respective groups G1 and G2 are described merely for the sake of convenience of description. Thus, the pair of data lines corresponding to the first data line group G1 and the pair of data lines corresponding to the second data line group G2 may be interchanged. That is, the first data line group G1 may be disposed at both sides of the circuit pixel unit 120 and the second data line group G2 may be disposed between the sub-pixel circuit units 121 and 122 or the sub-pixel circuit units 123 and 124.

In addition, the data line group may have a pair of data lines, spaced apart from each other with a certain distance along the first direction, and extending along the second direction. Thus, a certain space along the second direction, is provided between the pair of data lines. Furthermore, a power supply line extending along the second direction may be disposed in the above-described certain space as the certain space is extending along the second direction.

Moreover, at least one signal line may be disposed along the second direction between a pair of data lines of one data line group.

At least one functional line capable of providing at least one additional function may be disposed within the data line group G1 or G2. The functional line may be a reference voltage line, a touch sensing line, an external compensation line, a discharge line, and/or an initial line. The width of each line may be different and at least one additional functional line can be disposed between the pair of data lines by defining the distance therebetween.

The above-described configuration is advantageous for minimizing interferences from other elements if a power supply line is disposed at the space provided between a pair of data lines, as the space extends along the second direction.

Further, it is advantageous for readily arranging lines by adjusting the distance between the pair of data lines of the data line group.

The gate line 108 is disposed at the center of the pixel circuit unit 120. In other words, the sub-pixel circuit units 121, 122, 123 and 124 of the pixel circuit unit 120 are disposed with respect to the gate line 108 such that two sub-pixel circuit units are disposed in the upper side and the other two sub-pixel circuit units are disposed in the lower side. Further, the gate lines 108 are connected to the sub-pixel circuit units 121, 122, 123 and 124 disposed in the upper side and the lower side, respectively.

For example, two sub-pixel circuit units 121 and 122 are disposed on the upper side of the gate line 108 and the two remaining sub-pixel circuit units 123 and 124 are disposed on the lower side of the gate line 108.

Further, no gate line 108 is disposed between the pixel circuit units 120 disposed along the second direction.

For example, a gate line 108 is disposed between the first sub-pixel circuit unit 121 and the fourth sub-pixel circuit unit 124 of the pixel circuit unit 120. Further, no gate line 108 is disposed between the above-described pixel circuit unit 120 and another pixel circuit unit 120 below (i.e., along Y-axis direction) the above-described pixel circuit unit 120.

In other words, a gate line 108 is disposed between the first sub-pixel circuit unit 121 and the fourth sub-pixel circuit unit 124 or the second sub-pixel circuit unit 122 and the third sub-pixel circuit unit 123, which are disposed along the second direction. However, no gate line 108 is disposed between the fourth sub-pixel circuit unit 124 and the first sub-pixel circuit unit 121 of an adjoining pixel unit disposed along the second direction or the third sub-pixel circuit unit 123 and the second sub-pixel circuit unit 122 of an adjoining pixel unit disposed along the second direction.

That is, gate lines 108 are sequentially disposed in a repeating manner along the second direction, a gate line is disposed between mutually different sub-pixel circuit units and the next gate line is not disposed (i.e., skipped) between the next mutually different sub-pixel circuit unit. In other respects, a gate line 108 extends along the first direction, is disposed between sub-pixel circuit units, and intersects the first data line group G1 and the second data line group G2.

An exemplary arrangement of a quad-type pixel circuit unit 120 with respect to corresponding gate lines 108 and data lines 110 are described above.

According to the above-described configuration, the number of gate lines 108 can be reduced by half compared to conventional gate lines. Further, if the number of the gate lines 108 is reduced, parasitic capacitance between each of the data lines 121, 122, 123 and 124 and the gate lines 108 can be reduced as the number of intersections of each of the data lines 121, 122, 123 and 124 and the gate lines 108 may be reduced. That is, an overall area of the intersections with respect to one data line and all of the gate lines can be reduced, which is advantageous for reducing parasitic capacitance between the data line 110 and the gate line 108.

According to the above-described configuration, there is a space where the gate line 108 is not disposed. In other words, a space is provided between the pixel circuit units 120 disposed along the second direction. Thus, it is advantageous for placing an additional line at that space, which can provide an added function. Accordingly, it is advantageous for realizing a high resolution top-emission type electro-luminescence display apparatus.

According to the above-described configuration, a pair of data lines 110 may be disposed between the pixel circuit units 120 disposed along the first direction. Further, a certain space may be provided between the pair of data lines along the second direction. Thus, it is advantageous for efficiently placing a power supply line, extending along the second direction, in the certain space, and for realizing a high resolution top-emission type electro-luminescence display apparatus.

According to the above-described configuration, the layout of each element can be optimized even if a fourth data line 114 and a fourth sub-pixel circuit unit 124 are added. Accordingly, it is advantageous for readily realizing a high-brightness electro-luminescence display apparatus.

To enlarge the high resolution electro-luminescence display apparatus, the line resistance value of the lines supplying a cathode voltage ELVSS and an anode voltage ELVDD should be sufficiently low and the layout of said lines should be optimized. Accordingly, a common line 104 and an anode line 106 are described below.

A common line 104, configured to supply cathode voltage ELVSS extends along the second direction and is disposed between a pair of data lines extended along the second direction. Further, an anode line 106, configured to supply anode voltage ELVDD extends along the second direction and is disposed between another pair of data lines extended along the second direction. Furthermore, the common line 104 and the anode line 106 are configured to be alternatively disposed along the first direction. A pixel circuit unit 120 is disposed between the common line 104 and the anode line 106.

The line width of the common line 104 may be larger than the line width of the anode line 106. This is because, the brightness uniformity of the electro-luminescence display apparatus 100 is more sensitive to change in the cathode voltage ELVSS when the cathode voltage ELVSS and the anode voltage ELVDD are identically changed. Thus, the line resistance value of the common line 104 can be configured to be lower than the line resistance value of the anode line 106. Accordingly, the width of the first data line group G1 (i.e., a space between the pair of data lines) may be wider than the width of the second data line group G2. But the present disclosure is not limited thereto.

The common line 104 and the anode line 106 are disposed on the gate line 108. Referring to FIG. 1, the gate line 108 is covered by the common line 104 and the anode line 106 at the crossing point of the gate line 108 with respect to the common line 104 or the anode line 106, and as the gate line 108 is disposed under the common line 104 and the anode line 106.

In some embodiments, the gate line 108 may be disposed over the common line 104 and the anode line 106.

The common line 104 and the anode line 106 may be disposed in the first data line group G1 and configured to be alternatively disposed along the first direction. Alternatively, the common line 104 and the anode line 106 may disposed in the second data line group G2 and configured to be alternatively disposed along the first direction.

A gap between a pair of data lines 111 and 112 of the first data line group G1 including a common line 104 therebetween may be wider than a gap between a pair of data lines 111 and 112 of the first data line group G1 including an anode line 106 there-between. That is, the gap can be adjusted according to the line width of the line disposed between the pair of data lines of the data line group.

A common line 104 may be disposed between the second data line 112 and the first data line 111 of the first data line group G1. Further, an anode line 106 may be disposed between the second data line 112 and the first data line 111 of another first data line group G1, which is alternatively disposed with the first data line group G1 including the common line 104.

According to the above-described configuration, the common line 104, the anode line 106 and the data line 110 extends along the second direction, and may not intersect with each other. Thus, it is advantageous that the common line 104, the anode line 106 and the data line 110 can be formed of the same material.

The above-described configuration is advantageous for minimizing any loss in space of the pixel area AA because a width of the gap can be adjusted according to a line width of a line disposed between a pair of data lines of a data line group.

In the above-described configuration, a common line 104 and an anode line 106 extend along the second direction, and are disposed at both sides of each pixel circuit unit 120, respectively. Thus, the pixel circuit 120 can receive the cathode voltage ELVSS from the common line 104 and the anode voltage ELVDD from the anode line 106 respectively. Therefore, it is advantageous for improving uniformity of potential difference between the cathode voltage ELVSS and the anode voltage of the plurality of sub-pixels 120 within the pixel area AA.

The anode line 106 is configured to further include an extension unit of the anode line 107. The extension unit of the anode line 107 is configured to be disposed between the alternatively disposed mutually different sub-pixel circuit units along the second direction (i.e., a gap between pixel circuit units disposed along the second direction) where the gate line 108 is not disposed.

For example, the gate line 108 is disposed between the first sub-pixel circuit unit 121 and the fourth sub-pixel circuit unit 124 which are disposed along the second direction, and the extension unit of the anode line 107 is disposed between the fourth sub-pixel circuit unit 124 and the first sub-pixel circuit unit 121, which are disposed along the second direction.

The extension unit of the anode line 107 may be made of a different material from the material of the anode line 106. In other words, if the data line 110 and the anode line 106 are made of the same metal layer then the anode line 106 may not be extended to the first direction over the data line 110. Accordingly, a different metal layer can be used at the intersection of the data line 110 and the anode line 106 to avoid any electrical connection between the data line 110 and the anode line 106 (e.g., jump line).

The extension unit of the anode line 107 and the anode line 106 are configured to be electrically connected through a contact-hole at the intersection. Further, the extension unit of the anode line 107 is configured to be connected to the adjacent sub-pixel circuit units of the pixel circuit units 120 on both side of the anode line 106 (e.g., the sub-pixel circuit units at upper and lower side of the extension unit of the anode line). The "X within a rectangular" shape as illustrated in the figures may be referred to a contact-hole.

The extension unit of the anode line 107 extends to the pixel circuit units 120 on both sides (e.g., along the first direction), and is disposed between common lines 104 at both side of the corresponding anode line 106. That is, the extension unit of the anode line 107 does not overlap or intersect with the common line 104. Accordingly, it is advantageous for supplying the anode voltage and reducing a parasitic capacitance between the common line 104 and the extension unit of the anode line 107.

The extension unit of the anode line 107 and the gate line 108 may be made of the same metal layer. But the present disclosure is not limited thereto, and an additional metal layer can be used for configuring the extension unit of the anode line 107.

In some embodiments, the extension unit of the anode line 107 may be extended along the first direction to intersect with the common line 104. Further, the extension unit of the anode line 107 may be further extended along the first direction to intersect with another anode line, and connected at the intersection by a contact-hole.

In some embodiments, the anode line 106 and the data line 110 are made of mutually different metallic layers. In such a case, even if the data line 110 and the anode line 106 intersect each other, they can be electrically insulated from each other. Thus, anode line 106 can be connected to corresponding sub-pixel circuit units, respectively, without the extension unit of the anode line 107 by using a direct patterning manufacturing method.

Accordingly, the sub-pixel circuit unit of the pixel area AA can be made of four mutually different sub-pixel circuit units with a quad-type arrangement. The mutually different sub-pixel circuit units may be alternatively disposed along the first direction and the other sub-pixel circuit units may be alternatively disposed along the second direction.

Data lines are disposed at both sides of the mutually different sub-pixel circuit units alternatively disposed along the second direction, respectively. Each sub-pixel circuit unit can be configured to be connected to the corresponding data line.

Furthermore, the data lines, disposed on both sides of the mutually different sub-pixel circuit units alternatively disposed along the second direction, may be connected in a zigzag pattern.

A pair of mutually different data line groups extending along the second direction may be disposed between sub-pixel circuit units alternatively disposed along the first direction. The mutually different data line groups may be alternatively disposed along the first direction.

Extension units of the anode line and the gate lines, which extend along the first direction and are spaced apart from each other along the second direction, may be alternatively disposed between the mutually different sub-pixel circuit units alternatively disposed along the second direction.

An anode line or a common lime may be disposed between mutually different data lines within a data line group.

The above-described configuration is advantageous for optimizing a separation distance between the common line 104 and the anode line 106 because of the layout with respect to the common line 104, the anode line 106, the gate line 108, the data line, and the pixel circuit 120 of the pixel area AA, such that a respective common line 104 and a respective anode line 106 are positioned within a respective data line group G1 and the data line groups G1 are disposed at both sides of a quad-type pixel circuit, respectively.

Further, it is advantageous for stably supplying a cathode voltage ELVSS and an anode voltage ELVDD to a pixel circuit, as a common line 104 is disposed at one side and an anode line 106 is disposed at an opposite side of the pixel circuit 120.

Figure 2:
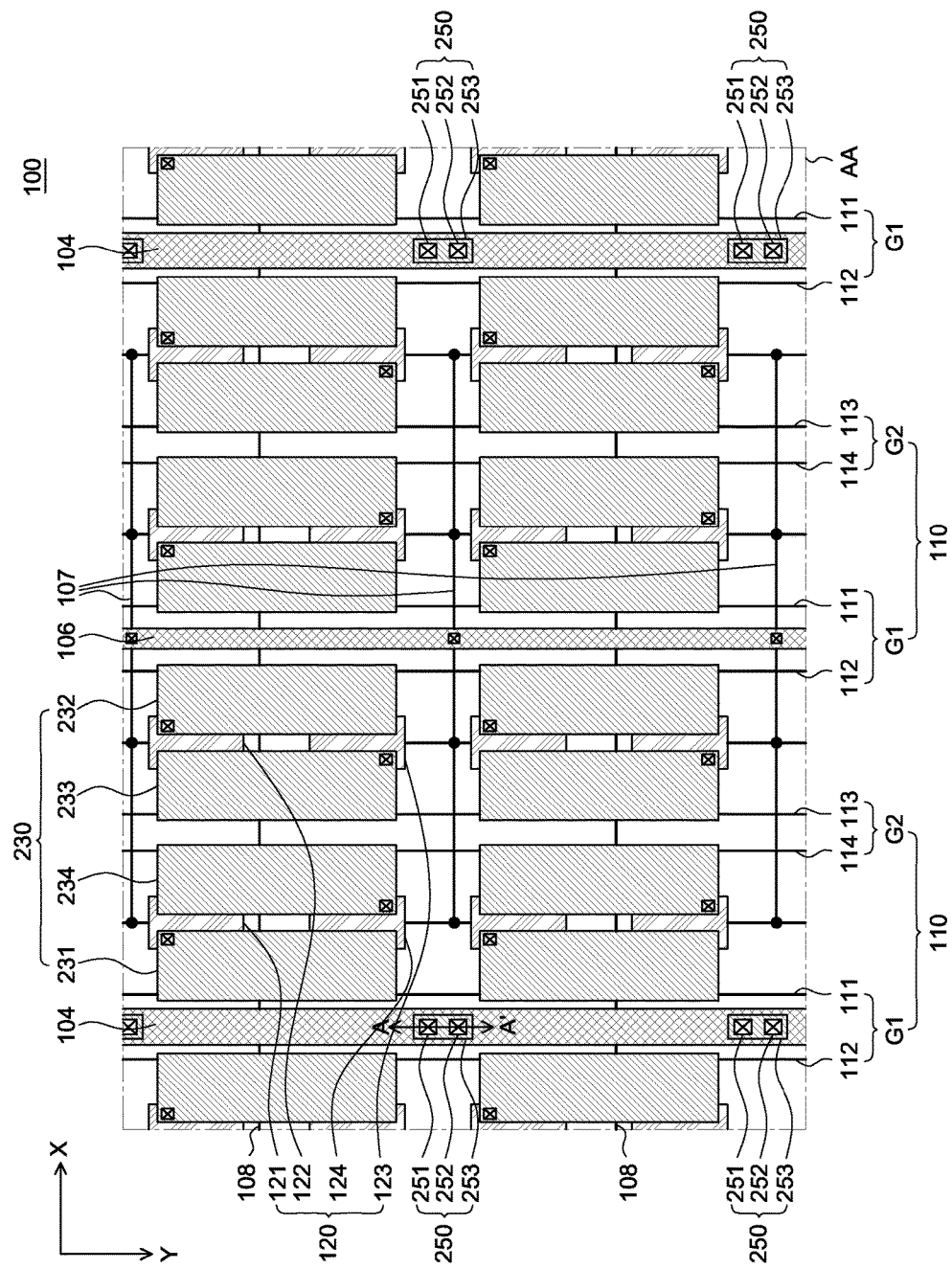
FIG. 2 is a schematic plan view illustrating a configuration of a pixel circuit unit, a pixel electrode electrically connected to a common line and a common line contact unit of an electro-luminescence display apparatus according to the exemplary embodiment illustrated in FIG. 1.

FIG. 2 is a schematic plan view illustrating configuration of a pixel circuit unit, a pixel electrode electrically connected to a common line and a common line contact unit of an electro-luminescence display apparatus according to the exemplary embodiment illustrated in FIG. 1.

FIG. 2 illustrates a pixel electrode 230, a common line contact unit 250 and various elements also illustrated in FIG. 1.

According to an exemplary embodiment of the present disclosure, the electro-luminescence display apparatus 100 is a top-emission type electro-luminescence display apparatus. Thus, an over-coating layer is present on the elements as illustrated in FIG. 1 and a pixel electrode 230 is patterned thereon.

The pixel electrode 230 is configured to include a first sub-pixel electrode 231, a second sub-pixel electrode 232, a third sub-pixel electrode 233, and a fourth sub-pixel electrode 234. But the present disclosure is not limited thereto.

In some embodiments, if the fourth sub-pixel circuit unit 124 is replaced with the second sub-pixel circuit unit 122, the fourth sub-pixel electrode 234 can be replaced with the second sub-pixel electrode 232. That is, it is possible to realize a pentile structure having two green sub-pixels.

The pixel electrode 230 is configured to be connected to a pixel circuit unit 120 by a contact-hole.

For example, the first sub-pixel electrode 231 is connected to the first sub-pixel circuit unit 121 by a contact-hole; the second sub-pixel electrode 232 is connected to the second sub-pixel circuit unit 122 by a contact-hole; the third sub-pixel electrode 233 is connected to the third sub-pixel circuit unit 123 by a contact-hole; and the fourth sub-pixel electrode 234 is connected to the fourth sub-pixel circuit unit 124 by a contact-hole.

The pixel electrode 230 can be patterned with various shapes, based on a consideration of the aperture ratio of the pixel electrode, the parasitic capacitance, and a desired layout efficiency.

Respective sub-pixel electrodes 231, 232, 233 and 234 may overlap with at least a portion of two mutually different sub-pixel circuit units disposed along the second direction. But the present disclosure is not limited thereto, and the sub-pixel electrodes may overlap with at least a portion of two mutually different sub-pixel circuit units disposed along the first direction For example, the first sub-pixel electrode 231 is configured to overlap with at least a portion of the first sub-pixel circuit unit 121 and the fourth sub-pixel circuit unit 124; the second sub-pixel electrode 232 is configured to overlap with at least a portion of the second sub-pixel circuit unit 122 and the third sub-pixel circuit unit 123; the third sub-pixel electrode 233 is configured to overlap with at least a portion of the second sub-pixel circuit unit 122 and the third sub-pixel circuit unit 123; and the fourth sub-pixel electrode 234 is configured to overlap with at least a portion of the first sub-pixel circuit unit 121 and the fourth sub-pixel circuit unit 124.

According to the arrangement of the pixel electrode 230, the respective sub-pixel electrodes 231, 232, 233 and 234 may be in a shape having a wider width along the second direction than the first direction (e.g., sub-pixel electrode with a stripe shape). Further, the layout of the sub-pixel electrode with the stripe shape, it is advantageous for optimizing an aperture ratio of the pixel electrode. But the present disclosure is not limited thereto, and the respective sub-pixel electrodes 231, 232, 233 and 234 of the pixel electrode 230 may be in a shape having a wider width along the first direction than the second direction.

The stripe shaped pixel electrode is not limited to a rectangular shape, and may the shape of each sub-pixel electrode may be a rectangular lookalike shape. Further, the corner of the sub-pixel electrode may be curved instead of a right angle; and a protrusion portion may be formed at the contact-hole area for connecting the pixel circuit unit. That is, the outline of each sub-pixel electrode can variously modified as required.

At least one sub-pixel electrode among the pixel electrode 230 may be configured to overlap with at least one line. But the present disclosure is not limited thereto.

For example, at least one sub-pixel among the sub-pixel electrodes 231, 232, 233 and 234 may be configured to overlap with at least one data line among the data lines 111, 112, 113 and 114.

Sub-pixel electrodes 231, 232, 233 and 234 may be configured to overlap with adjacent corresponding data lines 111, 112, 113 and 114, respectively.

For example, if the shape of the respective sub-pixel electrodes 231, 232, 233 and 234 has a wider width along the second direction than the first direction, the first sub-pixel electrode 231 may be configured to overlap with the adjacent first data line 111; the second sub-pixel electrode 232 may be configured to overlap with the adjacent second data line 112; the third sub-pixel electrode 233 may be configured to overlap with the adjacent third data line 113; and the fourth sub-pixel electrode 234 may be configured to overlap with the adjacent fourth data line 114.

Additionally, the first sub-pixel electrode 231 may be configured to overlap with a gate line 108; the second sub-pixel electrode 232 may be configured to overlap with a gate line 108; the third sub-pixel electrode 233 may be configured to overlap with a gate line 108; and the fourth sub-pixel electrode 234 may be configured to overlap with a gate line 108.

Further, at least one sub-pixel electrode among the pixel electrodes 230 may be configured to overlap with a common line 104, and at least one sub-pixel electrode among the pixel electrodes 230 may be configured to overlap with an anode line 106.

The above-described overlapping layout of at least one sub-pixel electrode and at least one data line is advantageous for increasing an area of the pixel electrode 230, thereby increasing an aperture ratio of the pixel electrode. Further, it is advantageous for reducing the parasitic capacitance effect, if the sub-pixel electrode and the overlapping data line are electrically connected to each other (e.g., if the red sub-pixel electrode is overlapped with the red data line).

A pair of sub-pixel electrodes overlaps with at least a portion of a pair of sub-pixel circuit units alternatively disposed along the second direction, and the pair of sub-pixel electrodes overlap with a gate line extended along the first direction, disposed between a pair of sub-pixel circuit units. But the present disclosure is not limited thereto.

For example, the first sub-pixel electrode 231 overlaps with at least portions of the first sub-pixel circuit unit 121 and the fourth sub-pixel circuit unit 124, the fourth sub-pixel electrode 234 overlaps with at least portions of the first sub-pixel circuit unit 121 and the fourth sub-pixel circuit unit 124, and the gate line 108 overlaps with the first sub-pixel electrode 231 and the fourth sub-pixel electrode 234. Further, the gate line 108 is electrically connected to the first sub-pixel circuit unit 121 and the fourth sub-pixel circuit unit 124, the second sub-pixel electrode 232 overlaps with at least portions of the second sub-pixel circuit unit 122 and the third sub-pixel circuit unit 123, the third sub-pixel electrode 233 overlaps with at least portions of the second sub-pixel circuit unit 122 and the third sub-pixel circuit unit 123, and the gate line 108 overlaps with the second sub-pixel electrode 232 and the third sub-pixel electrode 233. Further, the gate line 108 is electrically connected to the second sub-pixel circuit unit 122 and the third sub-pixel circuit unit 123

The above-described overlapping layout of a pair of sub-pixel electrode 231 and 234, a pair of sub-pixel circuit unit 121 and 124 and a gate line 108 is advantageous for optimizing the layout of the pixel area AA, thereby realizing a high resolution top-emission type electro-luminescence display apparatus.

A common line contact unit 250 is configured to include an exposed electro-luminescence layer part 251, a common line contact unit contact-hole 252, and a connect electrode 253. The common line contact unit 250 is configured to be disposed at a certain distance on the common line 104. The common line 104 and the common electrode 436 are configured to be electrically connected through the common line contact unit 250.

The exposed electro-luminescence layer part 251 (e.g., an area configured to interconnect a common electrode and an auxiliary common line) includes a structure having a reverse-tapered shape. Further, an area where the electro-luminescence layer is not deposited is formed under the structure having a reverse-tapered shape. A cathode is electrically connected to the connect electrode 253 by the area where the electro-luminescence layer is not deposited. The connect electrode 253 is electrically connected to the common line 104 by the common line contact unit contact-hole 252. The common line contact unit 250 will be described in detail with reference to FIG. 5.

Figure 3:
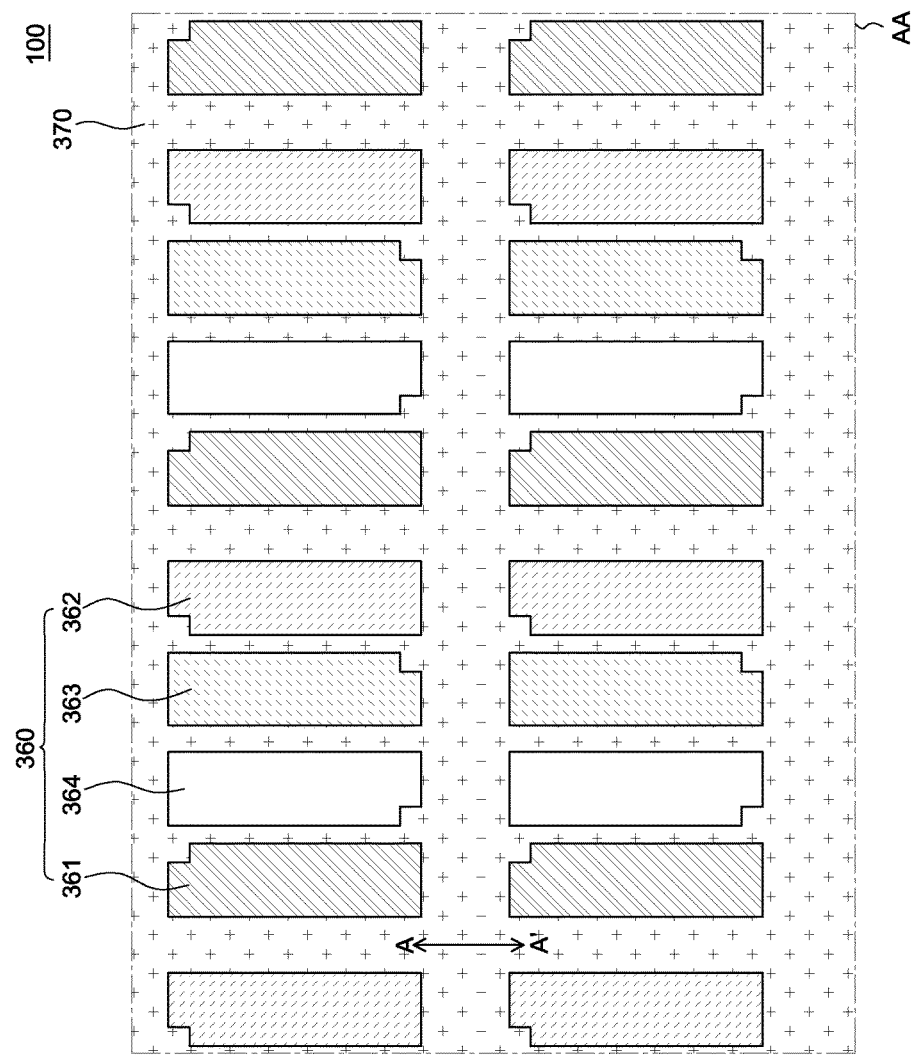
FIG. 3 is a schematic plan view illustrating a black matrix and a color filter on the pixel electrode of an electro-luminescence display apparatus according to the exemplary embodiment illustrated in FIG. 2.

FIG. 3 is a schematic plan view illustrating a black matrix and a color filter on the pixel electrode of an electro-luminescence display apparatus 100 according to the exemplary embodiment illustrated in FIG. 2.

In FIG. 3, a black matrix 370 and a color filter 360, which are disposed on the various elements illustrated in FIG. 2 are further illustrated for convenience of explanation.

The color filter 360 may be configured to include a first color filter 361 as a red color filter, a second color filter 362 as a green color filter, a third color filter 363 as a blue color filter, and a fourth color filter 364 as a white color filter. But the present disclosure is not limited thereto.

The black matrix 370 is configured to surround the color filter 360. The black matrix 370 can be made of a material having a light absorbing characteristic, which has an absorption rate of visible wavelengths of over 90%.

The color filter 360 is disposed with respect to the pixel electrode 230. Further, the organic light emitting diode configured on the pixel electrode 230 is configured to emit red, green, blue, or white light.

For example, the first color filter 361 overlaps with the first sub-pixel electrode 231; the second color filter 362 overlaps d with the second sub-pixel electrode 232; the third color filter 362 overlaps with the third sub-pixel electrode 233; and the fourth color filter 364 overlaps with the fourth sub-pixel electrode 234. The fourth color filter 364 may be transparent or configured of a transparent layer having a transmittance of over 90% for the visible wavelength spectrum. But the present disclosure is not limited thereto, and the fourth color filter 374 can be configured as an opening configured to pass the light without any transparent layer.

For example, the organic light emitting diode on the first sub-pixel electrode 231 is configured to emit white or red light; the organic light emitting diode on the second sub-pixel electrode 232 is configured to emit white or green light; the organic light emitting diode on the third sub-pixel electrode 233 is configured to emit white or blue light; and the organic light emitting diode on the fourth sub-pixel electrode 234 is configured to emit white light.

In some exemplary embodiments, at least one color filter may be made of a quantum-dot substance, which converts the wavelength of the light incident on the quantum-dot substance to other wavelengths (e.g., blue light to green or red light).

The above-described configuration of the electro-luminescence display apparatus 100 can selectively transmit, filter and/or convert wavelengths of the organic light emitting diode overlapping with the color filter. In addition, it is advantageous for reducing the level of color mixture as the color filter is capable of selectively absorbing light entering from the adjacent organic light emitting diode. Further, it is advantageous for improving the degree of color purity (e.g., the narrower emitting wavelength spectrum) by the color filter when the emitting wavelength spectrum of the organic light emitting diode is broader than the band-pass wavelength spectrum of the overlapping color filter. Accordingly, a wider color gamut can be achieved. Furthermore, the color filter 360 can absorb a portion of ambient light. Thus, it is advantageous for increasing an ambient contrast ratio. Moreover, it is advantageous for filtering an undesired emitting wavelength spectrum from among the various emitting wavelength spectra of the organic light emitting diode.

Figure 4:
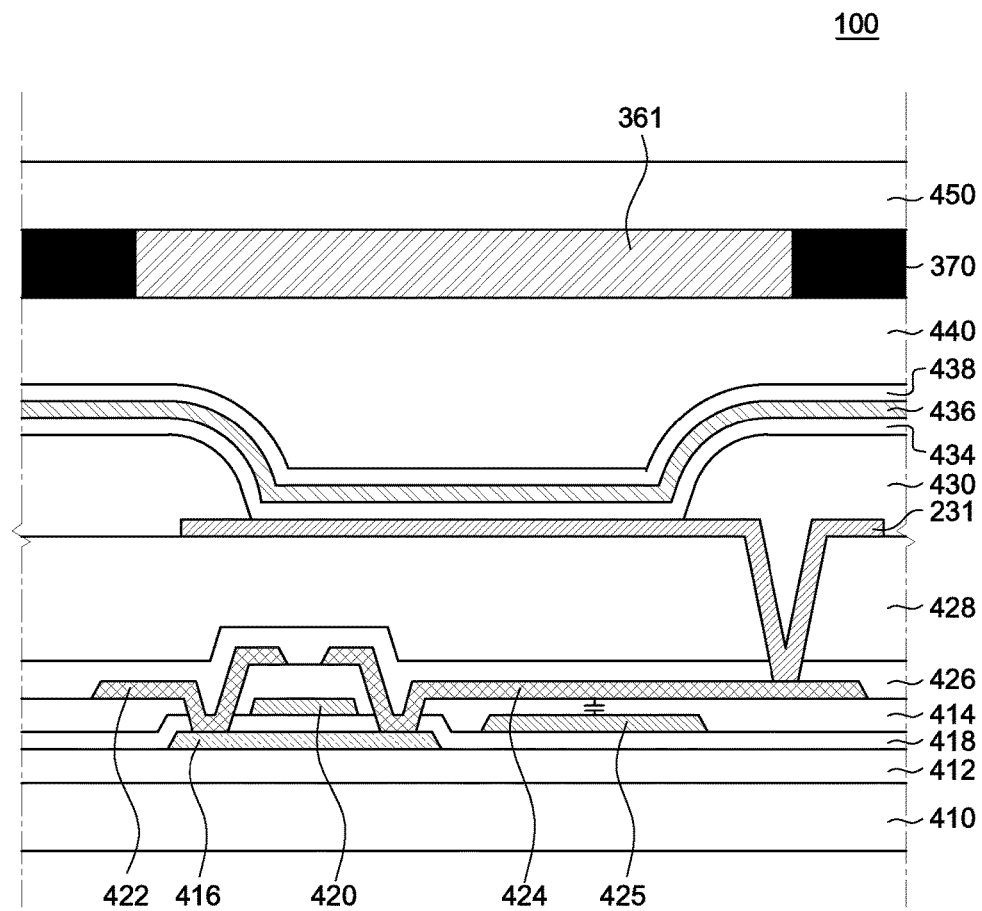
FIG. 4 is a schematic cross-sectional view illustrating an arrangement of a first sub-pixel circuit unit, a first sub-pixel electrode and a first color filter of an electro-luminescence display apparatus 100 according to an exemplary embodiment of the present disclosure.

FIG. 4 is a schematic cross-sectional view illustrating an arrangement of a first sub-pixel circuit unit, a first sub-pixel electrode and a first color filter of an electro-luminescence display apparatus according to an exemplary embodiment of the present disclosure.

FIG. 4 illustrates a cross-section view of a portion of various elements as illustrated in FIG. 1 to FIG. 3 including a first substrate 410, an insulation buffer layer 412, an interlayer insulation layer 414, a semiconductor layer 416, a gate insulation layer 418, a gate electrode 420, a drain electrode 422, a source electrode 424, a capacitor electrode 425, a first insulation layer 426, an overcoat insulation layer 428, a bank 430, a first sub-pixel electrode 231, an electro-luminescence layer 434, a common electrode 436, a second insulation layer 438, a transparent filling material 440, a black matrix 370, a first color filter 361, and a second substrate 450. Unless otherwise specified, the embodiments of the present disclosure described below will be configured on a basis of the structure illustrated in FIG. 4.

The first substrate 410 can protect and support various elements of the electro-luminescence display apparatus 100. The first substrate 410 can be made of various materials, for example, it can be made of glass or plastic. But the present disclosure is not limited thereto.

The insulation buffer layer 412 is positioned on the first substrate 410. The insulation buffer layer 412 may be configured to protect the semiconductor layer 416 from residual impurities and residual oxygen on the first substrate 410, and/or moisture and oxygen permeating through the first substrate 410. Further, the insulation buffer layer 412 may be provided to enhance surface adhesion for some elements disposed on the first substrate 410. The insulation buffer layer 412 may be configured of an inorganic material. Thickness of each layer described below can be construed to have a ±10% tolerance range.

For example, the insulation buffer layer 412 may be alternatively stacked with silicon oxide (SiOx) and silicon nitride (SiNx), and the thickness of each layer may be about 1000 Å. Alternatively, the insulation buffer layer 412 may be made of a single layer of silicon oxide (SiOx) having a thickness of about 5000 Å. But the present disclosure is not limited thereto. Furthermore, the insulation buffer layer 412 may be removed for improving flexibility if the electro-luminescence display apparatus 100 is a flexible display apparatus.

The semiconductor layer 416 is positioned on the insulation buffer layer 412. The semiconductor layer 416 can be used as a channel of a thin-film transistor. If the insulation buffer layer 412 is not implemented, the semiconductor layer 416 may be positioned directly on the first substrate 410. The semiconductor layer 416 may be made of an oxide semiconductor (e.g., IGZO), a poly silicon semiconductor (e.g., LTPS), and/or an amorphous silicon semiconductor (e.g., a-Si). The thickness of semiconductor layer 416 may be approximately 400 Å. But the present disclosure is not limited thereto. The semiconductor layer 416 may be implemented as an on/off functioning switching element, and/or a current controlling element for precisely controlling an amount of current flow. But the present disclosure is not limited thereto.

The gate insulation layer 418 may be interposed between the semiconductor layer 416 and the gate electrode 420. The gate insulation layer 418 may be configured to insulate the semiconductor layer 416 and the gate electrode 420. The thickness of the gate insulation layer 418 may be a suitable thickness for switching the semiconductor layer 416 from a conductive state to a non-conductive state, or precisely controlling an amount of current flowing through the semiconductor layer 416. For example, the gate insulation layer 418 may be an inorganic layer, the inorganic material being selected from silicon oxide (SiOx) or silicon nitride (SiNx), and the thickness of the inorganic layer may be about 2000 Å. But the present disclosure is not limited thereto. For example, the thickness of the gate insulation layer 418 may be relatively thinner than the thickness of the insulation buffer layer 412 to allow control of the semiconductor layer 416. But the present disclosure is not limited thereto.

The gate electrode 420 is positioned on the gate insulation layer 418. The gate electrode 420 may be a gate electrode of a thin-film transistor. The electrical resistance value of the semiconductor layer 416 can be changed according to the voltage level applied to the gate electrode 420. The gate electrode 420 can be made of a metallic material, and may be electrically connected to a capacitor electrode. The gate electrode 420 may be formed of the same metal as the gate line 108, and the gate electrode 420 may be a portion of the gate line 108.

For example, the gate electrode 420 may be made of copper. The copper has very low resistivity, therefore the electrical property is excellent. But the present disclosure is not limited thereto.

Alternatively, the gate electrode 420 may be a multilayered-structure such that a molybdenum alloy such as molybdenum-titanium (MoTi) is disposed on the copper. The molybdenum-titanium increases interface adhesion strength. But the present disclosure is not limited thereto.

The gate electrode 420 may be a stacked structure with a copper layer having a thickness of about 4500 Å on an upper side and a molybdenum-titanium layer having a thickness of about 300 Å on a lower side. But the present disclosure is not limited thereto.

The capacitor electrode 425 may be made of the same material as the gate electrode 420, and is configured to be electrically connected to the gate electrode 420. A capacitance can be generated by the capacitor electrode 425 overlapping with or facing the source electrode 424, which are electrically insulated from each other by the interlayer insulation layer 414. As the overlapping area of the capacitor electrode 425 and the source electrode 424 increases, the capacitance can also be increased accordingly.

For example, a portion of the source electrode 424 overlapping with the capacitor electrode 425 may be an extended portion of the sourced electrode 424. Further, a portion of the capacitor electrode 425 overlapping with the source electrode 424 may be an extended portion of the gate electrode 420. But the present disclosure is not limited thereto.

In some exemplary embodiments, a portion of the capacitor electrode 425 may be made of the same material as the semiconductor layer 416. Further, a portion of the capacitor electrode 425 may be made of the same material as the gate electrode 420 and another portion of the capacitor electrode 425 may be made of the same material of the semiconductor layer 416.

In other exemplary embodiments, an extended portion of the gate electrode 420 overlaps with the capacitor electrode 425 made of the same material of the semiconductor layer 416, and a contact-hole, configured to electrically connect the capacitor electrode 425 and the gate electrode 420, is formed in the gate insulation layer 418 between the capacitor electrode 425 and the gate electrode 420.

If the capacitor electrode 425 is made of the same material as the semiconductor layer 416, the material is preferably processed to have a conductive characteristic to increase capacitance.

For example, if the material of the capacitor electrode 425 is and the semiconductor layer 416 is an oxide, the capacitor electrode 425 may be processed using a plasma treatment process. Alternatively, if the semiconductor layer 416 is a low temperature poly silicon (LTPS), the capacitor electrode 425 can be processed using a p-type dopant doping process.

The interlayer insulation layer 414 is positioned on the gate electrode 420 and the capacitor electrode 425. The interlayer insulation layer 414 may be formed on the overall surface of the first substrate 410 and have a contact-hole configured to expose a portion of the semiconductor layer 416. For example, the interlayer insulation layer 414 may be configured to be an inorganic layer, and may be made of silicon oxide (SiOx) may have a thickness of about 6000 Å. But the present disclosure is not limited thereto.

The interlayer insulation layer 414 may be relatively thicker than the gate insulation layer 418 to reduce parasitic capacitance between the gate electrode 420, the second data line 112 and the source electrode 424 on the interlayer insulation layer 414. But the present disclosure is not limited thereto.

The thickness of the interlayer insulation layer 414 may be configured to be approximately three times thicker than a thickness of the gate insulation layer 418. But the present disclosure is not limited thereto.

The drain electrode 422 and the source electrode 424 are positioned on the interlayer insulation layer 414. But the present disclosure is not limited thereto, and alternatively, the drain electrode 422 and the source electrode 424 may be the source electrode or the drain electrode of the thin-film transistor, respectively.

The drain electrode 422 and the source electrode 424 are electrically connected to the semiconductor layer 416 through contact-holes configured in the interlayer insulation layer 414. The drain electrode 422 and the source electrode 424 may be made of a metallic material. For example, the drain electrode 422 and the source electrode 424 may be made of copper. But the present disclosure is not limited thereto.

The drain electrode 422 and the source electrode 424 may also be a multilayered-structure structure having a molybdenum-titanium layer disposed under a copper layer. But the present disclosure is not limited thereto.

The drain electrode 422 and the source electrode 424 may be a multilayered-structure such that the copper layer has a thickness of about 6000 Å and the molybdenum-titanium layer has a thickness of about 300 Å. But the present disclosure is not limited thereto.

Alternatively, the drain electrode 422 and the source electrode 424 may be a multilayered-structure including an upper layer may be made of ITO having a thickness of about 500 Å, a middle layer made of copper having a thickness of about 6000 Å, and a lower layer made of a molybdenum-titanium alloy and having a thickness of about 300 Å. But the present disclosure is not limited thereto.

The drain electrode 422 and source electrode 424 may transmit an image signal or an anode voltage. Therefore, the line resistance of the drain electrode 422 and the source electrode 424 may be lower than the line resistance of the gate electrode 420. Accordingly, a thickness of the drain electrode 422 and the source electrode 424 may be relatively thicker than a thickness of the gate electrode 420. Further, the thickness of the drain electrode 422 and the source electrode may be the same. But the present disclosure is not limited thereto.

In FIG. 4, for convenience of description, the N-type thin-film transistor is illustrated as a coplanar structure, but the present disclosure is not limited thereto, and a thin-film transistor may be realized in an inverted-staggered structure.

The first insulation layer 426 may be disposed on the drain electrode 422 and the source electrode 424. The first insulation layer may be configured to protect the thin-film transistor. A contact-hole may be formed in the first insulation layer 426 to connect the first sub-pixel electrode 231 and the thin-film transistor.

The first insulation layer 426 may be made of an inorganic layer. For example, the first insulation layer 426 may be made of silicon oxide (SiOx) having a thickness of about 3500 Å. But the present disclosure is not limited thereto.

In some embodiments, the first insulation layer 426 may be omitted.

An overcoat insulation layer 428 may be positioned on the first insulation layer 426. The overcoat insulation layer 428 is an organic insulation layer configured to planarize the upper portion of the thin-film transistor. A contact-hole may be formed in the overcoat insulation layer 428 to connect the first-sub-pixel electrode 231 and the thin-film transistor. Furthermore, this contact-hole may be aligned with the contact-hole of the first insulation layer 426.

For example, the overcoat insulation layer 428 may be formed of a negative overcoat material, and may have a thickness of about 2 μm. But the present disclosure is not limited thereto.

The organic light emitting diode is positioned on the overcoat insulation layer 428. The organic light emitting diode includes the first sub-pixel electrode 231, the electro-luminescence layer 434, and the common electrode 436.

The first sub-pixel electrode 231 supplies a hole to the electro-luminescence layer 434, and is connected to the source electrode 424 of the thin-film transistor. That is, the first sub-pixel electrode 231 is configured to function as an anode.

According to an exemplary embodiment of the present disclosure, an electro-luminescence display apparatus 100 is a top-emission type electro-luminescence display apparatus. Thus, the first sub-pixel electrode 231 may include a conductive reflective layer having a high visible wavelengths reflectance or an additional reflective layer disposed under the first sub-pixel electrode 231.

For example, the reflective layer may be made of silver (Ag), a silver alloy (Ag alloy), an APC alloy, a molybdenum-titanium (MoTi) alloy and the like having a mirror characteristic. Further, a thickness of the reflective layer may be approximately 1000 Å. But the present disclosure is not limited thereto.

Furthermore, a transparent conductive oxide material such as indium-tin-oxide (ITO) or indium-zinc-oxide (IZO) having a thickness of about 100 Å may be formed on the reflective layer. But the present disclosure is not limited thereto.

The bank 430 is configured to cover the boundary of the first sub-pixel electrode 231 on the overcoat insulation layer 428. The bank 430 may be made of an organic insulation layer.

For example, the bank 430 may be made of polyimide, and may have a thickness of about 1.8 μm. But the present disclosure is not limited thereto.

The electro-luminescence layer 434 may be made of organic emission material for emitting white light, and may comprise at least one organic emission material layer. A specific emission spectrum can be configured according to the configuration of the electro-luminescence layer 434.

For example, the electro-luminescence layer 434 may emit red, green, blue and/or white light. Further, the emitted light may be selectively filtered according to the first color filter 361. But the present disclosure is not limited thereto.

The electro-luminescence layer 434 is configured to include at least one common layer. The common layer may be a layer disposed on every sub-pixel in common. For example, a common layer may be a hole-transport layer (HTL), an electro-luminescence layer (ELL), an electron-injection layer (EIL), a hole-injection layer (HIL) and the like. But the present disclosure is not limited thereto. The common layer can be manufactured by an open mask process, thereby covering the pixel area. However, according to the above-described configuration, the electro-luminescence layer 434 may have an electrically insulating characteristic. Accordingly, the common electrode 436 and the common line 104 are mutually insulated if the electro-luminescence layer 434 is interposed between the common electrode 436 and the common line 104. Therefore, the electro-luminescence layer 434 is removed at the connecting area of the common electrode 436 and the common line 104.

The common electrode 436 is positioned on the electro-luminescence layer 434. The common electrode 436 is a layer supplying an electron. As the electro-luminescence display apparatus 100 is a top-emission type electro-luminescence display apparatus, the common electrode 436 may be made of a very thin metal material having a low work function value or a transparent conductive oxide material. But the present disclosure is not limited thereto.

For example, the common electrode 436 may be made of indium-zinc-oxide (IZO) having a thickness of about 1200 Å. But the present disclosure is not limited thereto. The common electrode 436 is configured to be connected to a common line contact unit 250.

The second insulation layer 438 is positioned on the common electrode 436. The second insulation layer 438 protects the electro-luminescence layer 434 from moisture, oxygen and/or hydrogen. The second insulation layer 438 may be made of an inorganic material.

For example, the second insulation layer 438 may be made of a silicon-oxynitride (SiONx), a silicon oxide (SiOx), and/or a silicon nitride (SiNx). Preferably, the second insulation layer 438 may be made of silicon-oxynitride (SiONx) having a thickness of about 1 μm. But the present disclosure is not limited thereto.

The transparent filling material 440 is positioned on the second insulation layer 438. The transparent filling material 440 can planarize any steps formed by the patterned bank 430, the overcoat insulation layer 428, and the first insulation layer 426. The transparent filling material 440 may be made of a transparent organic material.

For example, the transparent filling material 440 may be a polymer resin, an acrylic resin, or an epoxy resin. But the present disclosure is not limited thereto.

Further, the second insulation layer 438 between the common electrode 436 and the transparent filling material 440 can be removed.

The first color filter 361 is positioned on the transparent filling material 440, and corresponds to the first sub-pixel electrode 231.

The black matrix 370 is configured to surround the first color filter 361.

The second substrate 450 can protect and support the various elements of the electro-luminescence display apparatus 100. The second substrate 450 may be made of various materials. For example, it can be made of glass or plastic, but the present disclosure is not limited thereto. The second substrate 450 is configured to support at least the first color filter 361 and the black matrix 370.

Figure 5:
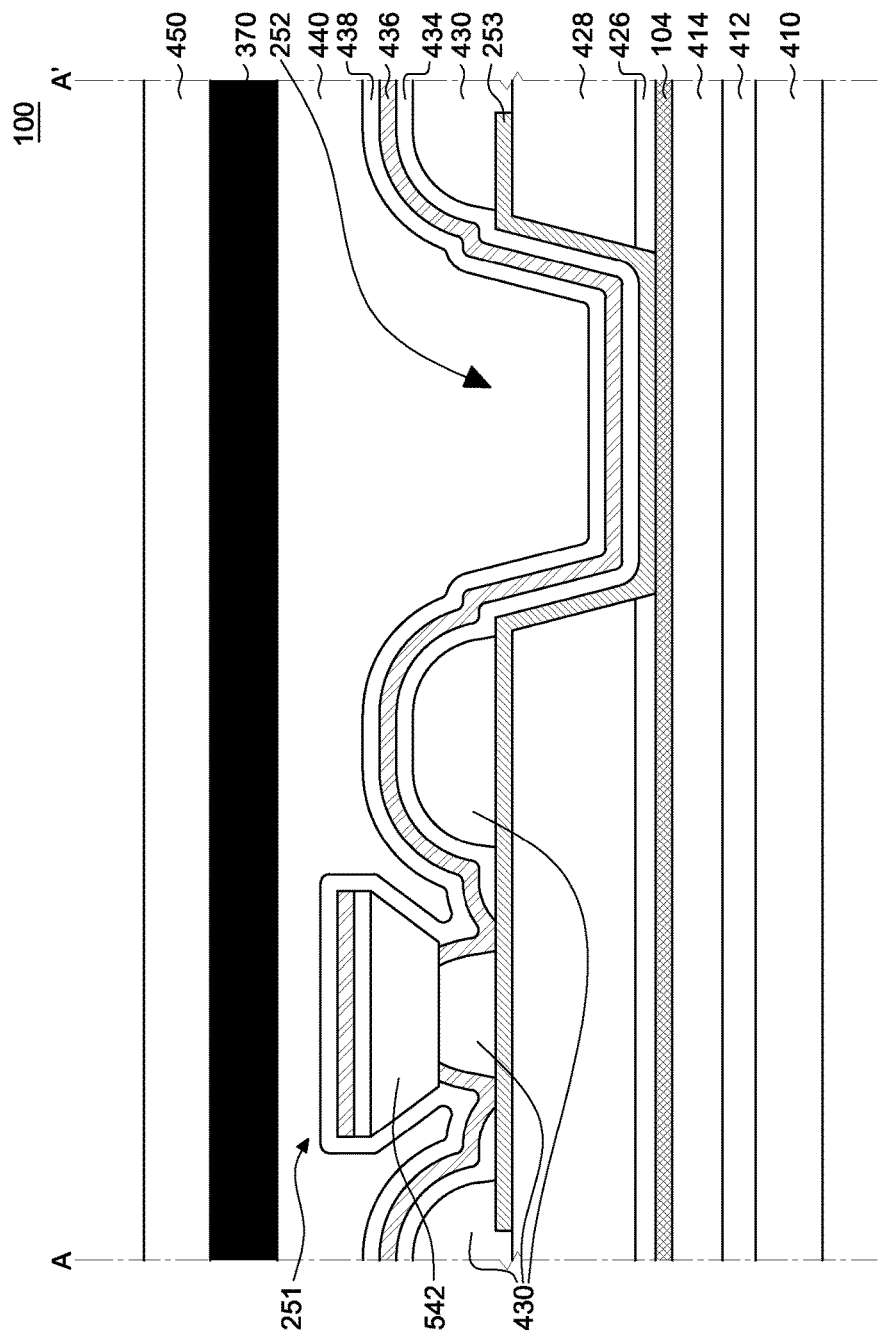
FIG. 5 is a schematic cross-sectional view illustrating a common line contact unit of an electro-luminescence display apparatus 100 according to an exemplary embodiment of the present disclosure.

FIG. 5 is a schematic cross-sectional view illustrating a common line contact unit of an electro-luminescence display apparatus according to an exemplary embodiment of the present disclosure. FIG. 5 corresponds to the cross-sectional line A-A' of FIG. 2. Redundant features thereof will be omitted for brevity and convenience of description.

A common line contact unit 250, configured to connect the common line 104 and the common electrode 436, is disposed at the cross sectional line A-A' of FIG. 2.

The common line contact unit 250 is configured to include an exposed electro-luminescence layer part 251, a common line contact unit contact-hole 252, and a connect electrode 253.

The exposed electro-luminescence layer part 251 includes a reverse-tapered structure 542 positioned on the bank 430. That is, the bank 430 is configured to function as a column of the reverse-tapered structure 542. The area of the upper surface of the bank 430, which serves as the column, may be larger than the area of the bottom surface of the reverse-tapered structure 524. The reverse-tapered structure 524 may be a structure having an upper surface area that is larger than a lower surface area or the angle between the side surface and the upper surface of the reverse-tapered structure 542 is less than 90°. Furthermore, another bank 430 disposed on both sides of the bank 430 functions as the column of the reverse-tapered structure 542 and an opening, which is formed therebetween in the absence of the bank 430.

Moreover, an area configured to prevent a deposition of the electro-luminescence layer 434 is formed under the reverse-tapered structure 542. That is, the step-coverage ability of the electro-luminescence layer 434 is not superior to the step-coverage ability of the common electrode 436. Accordingly, the electro-luminescence layer 434 may not be deposited under the reverse-tapered structure 542. On the other hand, the common electrode 436 can be deposited under the reverse-tapered structure 542 as the step-coverage ability of the common electrode 436 is superior to the step-coverage ability of the electro-luminescence layer 434. Therefore, the common electrode 436 is electrically connected to the connect electrode 253 through the area where the electro-luminescence layer 434 is not deposited by the reverse-tapered structure 542.

The connect electrode 253 is disposed under the reverse-tapered structure 542 (e.g., under the bank 430 as the column disposed under the reverse-tapered structure 542). To be specific, the connect electrode 253 is disposed with the reverse-tapered structure 542 and the bank 430. Further, the connect electrode 253 extends to the common line contact unit contact-hole 252. The connect electrode 253 may be made of the same metal material as the pixel electrode 230.

The connect electrode 253 is electrically connected to the common line 104 through the common line contact unit contact-hole 252.

The common line contact unit contact-hole 252 is spaced apart from the exposed electro-luminescence layer part 251. The common line contact unit contact-hole 252 may be an area where a portion of the common line 104 is exposed by patterning or removing the overcoat insulation layer 428 and the first insulation layer 426.

The exposed electro-luminescence layer part 251 and the common line contact unit contact-hole 252 may be disposed along the extended direction of the common line 104 and spaced apart from each other.

For example, the exposed electro-luminescence layer part 251 and the common line contact unit contact-hole 252 may overlap with the common line 104, and may be disposed along the second direction within the area of the connect electrode 253.

According to the above-described exemplary embodiment, the common line contact unit 250, the common line 104 and the common electrode 436 are electrically connected to each other. Especially, the electrical resistance value of the common line 104 is lower than the electrical resistance value of the common electrode 436. Thus, it is advantageous for improving the brightness uniformity of the electro-luminescence display apparatus. Further, if the connect electrode 253 is made of the same material as the pixel electrode 230, the connect electrode 253 is readily formed by modifying the layout of the patterning mask of the pixel electrode 230. Accordingly, it is advantageous to simultaneously form the pixel electrode 230 and the connect electrode 253 without any additional manufacturing process.

Figure 6:
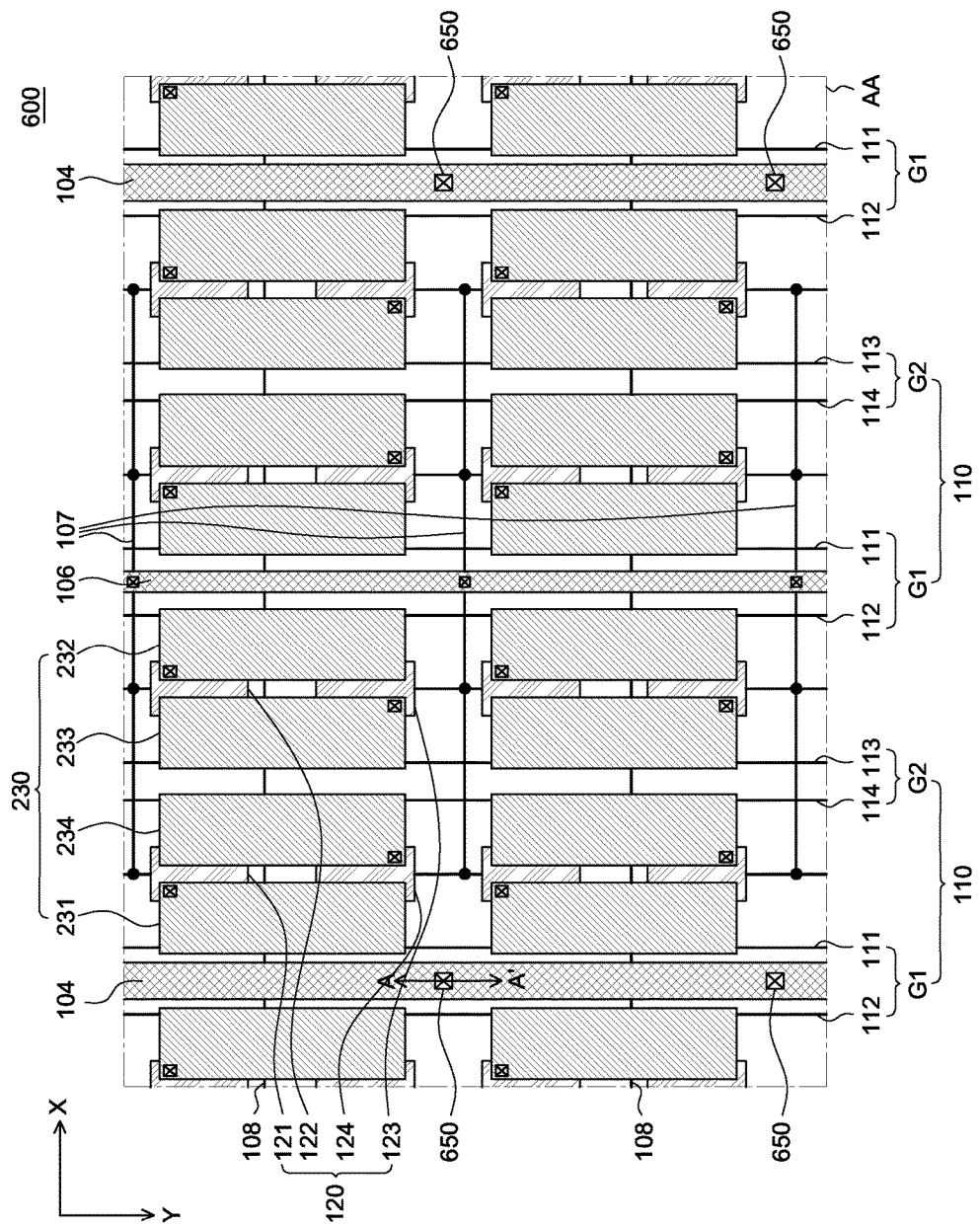
FIG. 6 is a schematic plan view illustrating an electro-luminescence display apparatus 600 according to another exemplary embodiment of the present disclosure.

FIG. 6 is a schematic plan view illustrating an electro-luminescence display apparatus 600 according to another exemplary embodiment of the present disclosure.

The electro-luminescence display apparatus 600 in comparison with the electro-luminescence display apparatus 100 is characterized in that the common line contact unit 250 is replaced with a common line welding unit 650. Further, redundant features will be omitted merely for brevity and convenience of description.

The common line welding unit 650 electrically connects the common line 104 and the common electrode 436, and is configured to electrically connect the common line 104 and the common electrode 436 by a laser irradiation process.

The laser irradiation process may be a laser welding, a laser contact, a thermal welding or the like.

Figure 7:
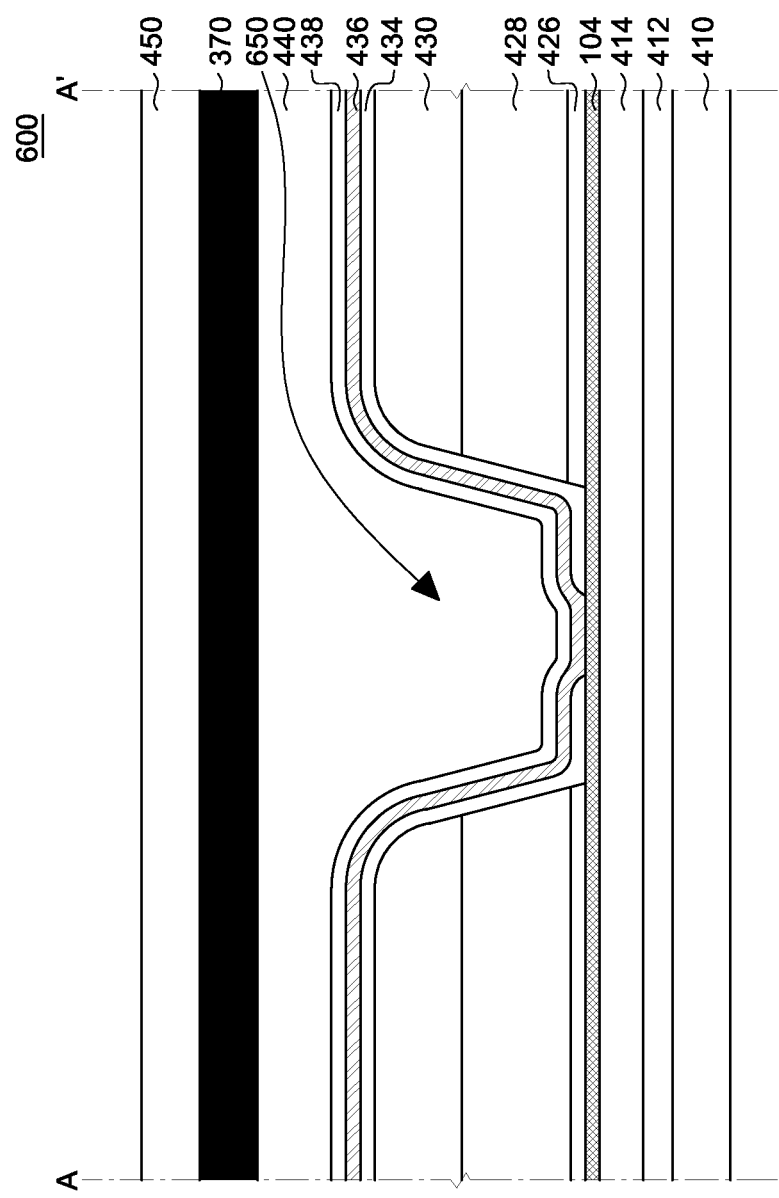
FIG. 7 is a schematic cross-sectional view illustrating a common line welding unit of the electro-luminescence display apparatus illustrated in FIG. 6.

FIG. 7 is a schematic cross-sectional view illustrating a common line welding unit of the electro-luminescence display apparatus 600.

FIG. 7 corresponds to the cross-sectional line A-A' of FIG. 6. In FIG. 7, the common line welding unit 650 and various other elements illustrated in FIG. 6 are omitted for brevity and convenience of description.

The common line welding unit 650 may be a contact-hole configured by patterning the insulation layers between the common electrode 436 and the common line 104.

The first insulation layer 426, the overcoat insulation layer 428 and the bank 430 on the common line welding unit 650 may be removed by a patterning process.

Accordingly, the electro-luminescence layer 434 may be solely disposed between the common line welding unit 650 and the common electrode 436. Further, if a laser is incident on the bottom surface of the first substrate 410, the laser passes through the layers having transparent characteristics, such as the first substrate 410, the insulation buffer layer 412, and the interlayer insulation layer 414. On the contrary, thermal heat is generated by the laser at the common line 104 made of metallic material because the laser cannot pass through it. Consequently, the electro-luminescence layer 434 which may be made of an organic material is burnt by the heat. Accordingly, the electro-luminescence layer 434 can be removed by the laser. Furthermore, the common electrode 436 may melt because of its metallic characteristic. Accordingly, the melted common electrode 436 and the common line welding unit 650 can be connected or welded together at the area where the electro-luminescence layer 434 is removed.

The laser welding process may be performed after the deposition of the common electrode 435. In such a case, the irradiation direction of the laser may be performed from the upper side of the common electrode 436 or the bottom side of the common line.

In some embodiments, the laser welding can be performed after the first substrate 410 and the second substrate 450 are bonded together. In such a case, the common line welding unit 650 can be shielded by the black matrix 370. Consequently, the laser may be incident on the bottom side of the common line 104.

In the above-described embodiment, the common line welding unit 650, the common line 104 and the common electrode 436 can be electrically connected. Further, if the common line welding unit 650 may be made of the same material as the pixel electrode 230, and the common line welding unit 650 may be readily formed by modifying the layout of the patterning mask of the pixel electrode 230. Consequently, it is advantageous for simultaneously forming the common line welding unit 650 with the common electrode 230 and the connect electrode 253 without an additional manufacturing process.

In addition, the second insulation layer 438 and/or the transparent filling material 440 can support the common electrode 436 during the laser welding process. Especially, the welded portion processed by the high temperature thermal energy of the laser welding can have a random shape. In such case, if the second insulation layer 438 and/or the transparent filling material 440 fill up the space over the common electrode 436, the degree of deformation of the common electrode 436 can be reduced when the common electrode 436 melts. This is advantageous for reducing the thermal energy delivered to the electro-luminescence layer 434, because the transparent filling material 440 may absorb a portion of the thermal energy.

Figure 8:
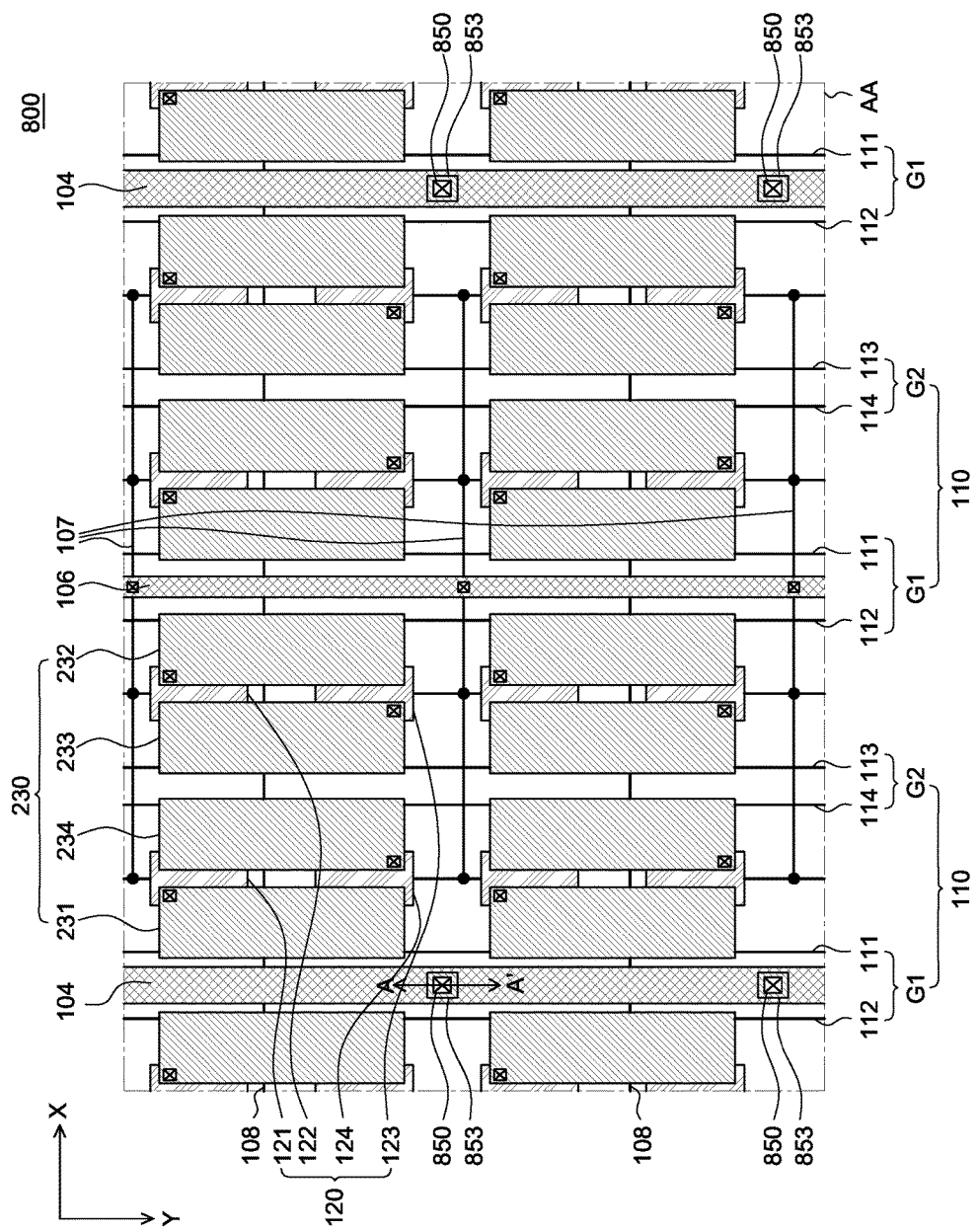
FIG. 8 is a schematic plan view illustrating an electro-luminescence display apparatus 800 according to yet another exemplary embodiment of the present disclosure.

The electro-luminescence display apparatus 800 according to yet another exemplary embodiment of the present disclosure is illustrated in FIG. 8.

FIG. 8 is a schematic plan view illustrating an electro-luminescence display apparatus 800 according to yet another exemplary embodiment of the present disclosure.

The electro-luminescence display apparatus 800 in comparison with the electro-luminescence display apparatus 600 is characterized in that a common line welding unit 850 further includes a connect electrode 853. Redundant features thereof are omitted for brevity and convenience of description.

Figure 9:
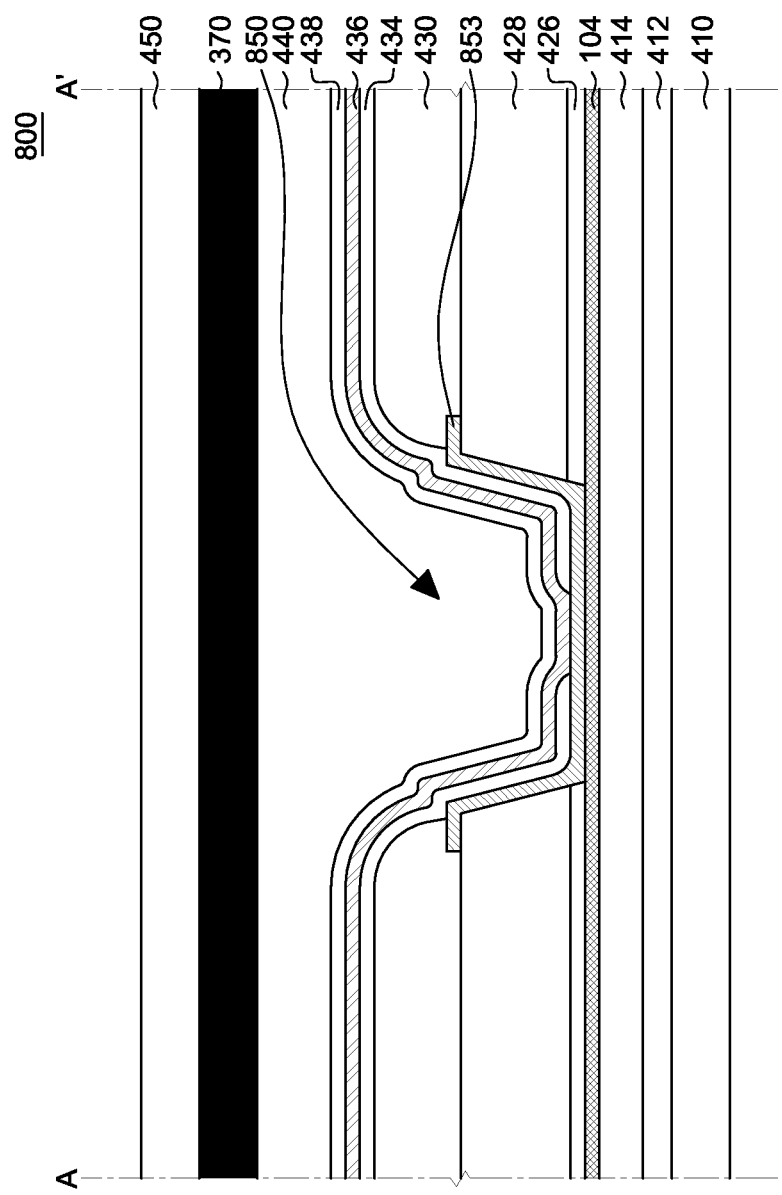
FIG. 9 is a schematic cross-sectional view illustrating a common line welding unit of the electro-luminescence display apparatus illustrated in FIG. 8.

FIG. 9 is a schematic cross-sectional view illustrating a common line welding unit of the electro-luminescence display apparatus 800. FIG. 9 corresponds to the cross-sectional line A-A' of FIG. 8. Redundant features thereof are omitted for brevity and convenience of description.

The connect electrode 853 may be made of the same material as the pixel electrode 230. Further, the connect electrode 853 is disposed between the common electrode 436 and the common line 104, thereby electrically connecting the common electrode 436 and the common line 104.

A portion of the connect electrode 853 may be disposed on the common line 104, another portion of the connect electrode 853 may be extended along the side of the patterned first insulation layer 426 and the patterned overcoat insulation layer 428, and, optionally, yet another portion of the connect electrode 853 may be extended up to a portion of interface of the overcoat insulation layer 428 and the bank 430. But the present disclosure is not limited thereto. But the present disclosure is not limited thereto, and the connect electrode 853 may be disposed only on the common line 104.

The electro-luminescence layer 434 may be solely disposed between the connect electrode 853 and the common electrode 436. Further, if a laser is incident on the bottom surface of the first substrate 410, the laser passes through the layers having transparent characteristics, such as the first substrate 410, the insulation buffer layer 412, and the interlayer insulation layer 414. Alternatively, if the laser cannot pass through the common line 104 made of metallic material, thermal heat may be generated. Consequently, the electro-luminescence layer 434, which may be made of an organic material, may be burnt. Accordingly, the electro-luminescence layer 434 may be removed by the laser. Furthermore, the common electrode 436 melts because of its metallic characteristic. Accordingly, the melted common electrode 436 and the connect electrode 853 can be connected or welded together at the area where the electro-luminescence layer 434 is removed.

In the above-described configuration, the thermal energy generated at the common line 104 can be transmitted to the connect electrode 853. Accordingly, the degree of the thermal energy dispersion through the common line 104 can be reduced. Thus, at least a portion of the thermal energy can be stored in the connect electrode 853. Consequently, the welding success rate can be increased and the temperature at the periphery area around the welded area can be decreased during the laser welding process at the welding area, which is an advantageous effect of the present disclosure.

Figure 10:
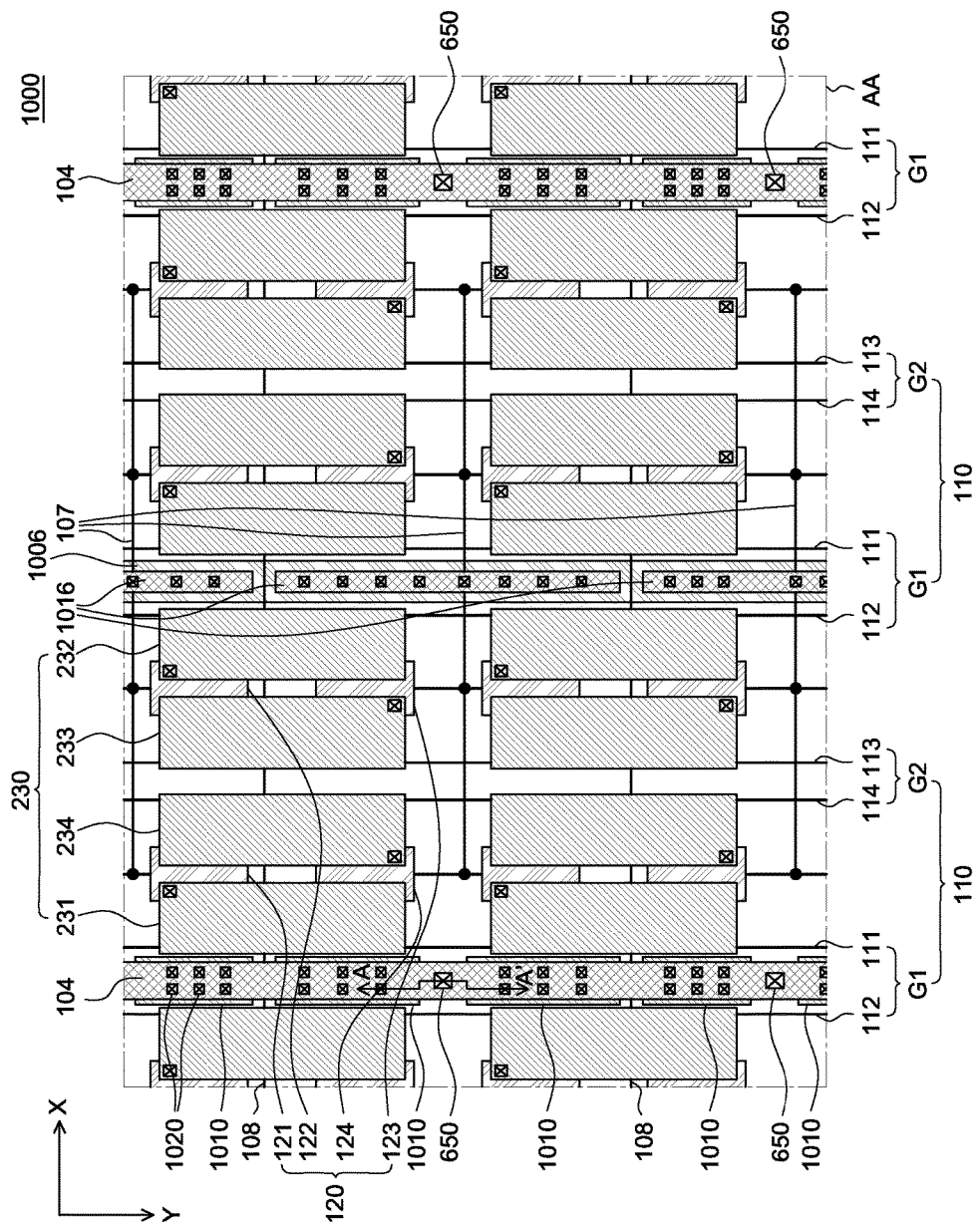
FIG. 10 is a schematic plan view illustrating an electro-luminescence display apparatus 1000 according to yet another exemplary embodiment of the present disclosure.
Figure 11:
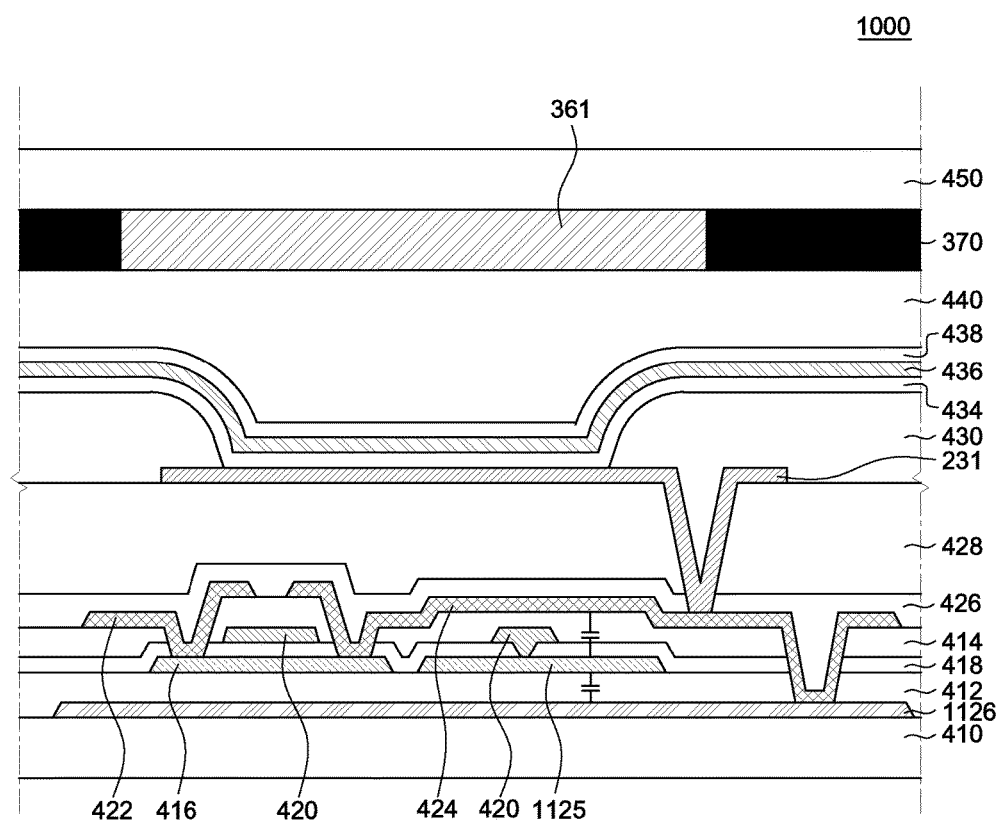
FIG. 11 is a schematic cross-sectional view illustrating an arrangement of a first sub-pixel circuit unit, a first sub-pixel electrode and a first color filter of the electro-luminescence display apparatus illustrated in FIG. 10.
Figure 12:
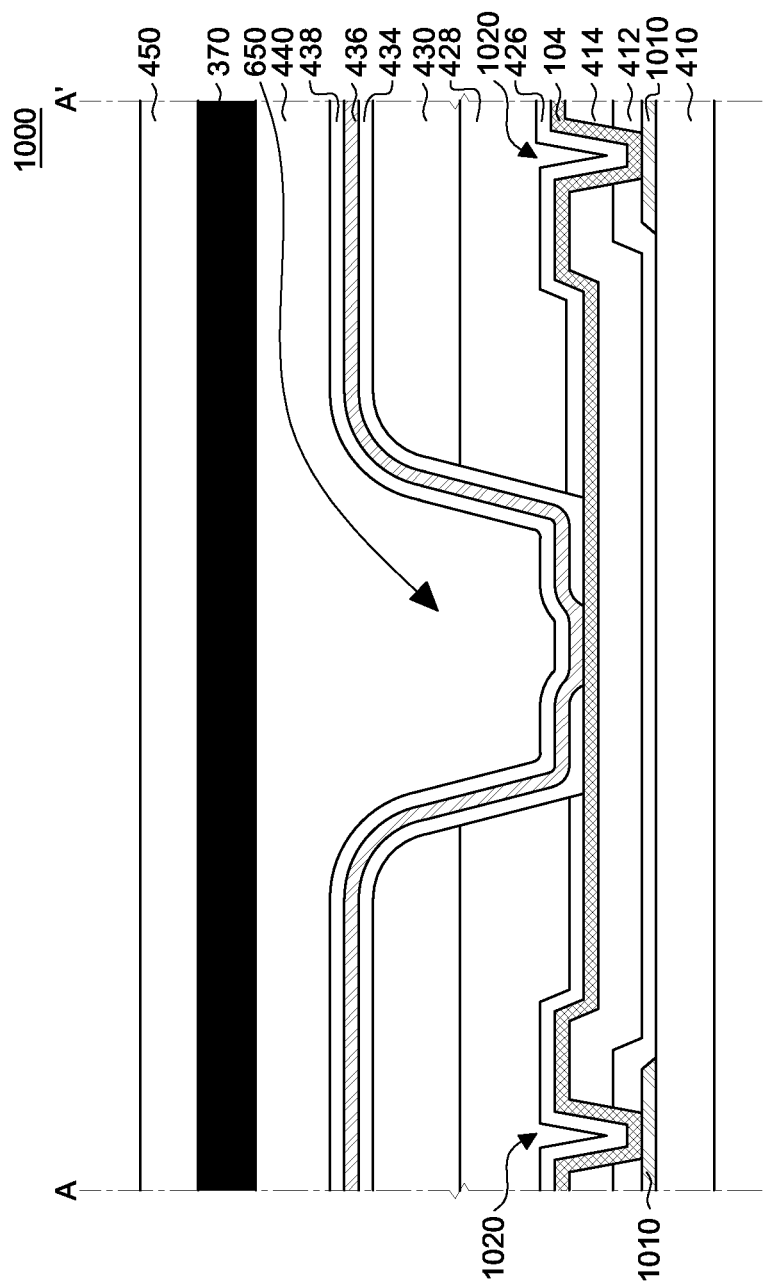
FIG. 12 is a schematic cross-sectional view along line A-A' of FIG. 10 illustrating a structure of an auxiliary common line adjacent to a common line welding unit.

The electro-luminescence display apparatus 1000 according to yet another exemplary embodiment of the present disclosure is illustrated in FIG. 10 to FIG. 12.

FIG. 10 is a schematic plan view illustrating an electro-luminescence display apparatus 1000.

The electro-luminescence display apparatus 1000 in comparison with the electro-luminescence display apparatuses 100 and 600 is characterized in that an auxiliary common line 1010 and an auxiliary anode line 1016 are further included. Redundant features thereof are omitted for brevity and convenience of description.

The auxiliary common line 1010 and the common line 104 may be configured to overlap each other and extend along the same direction (the second direction). At least one insulation layer is configured to be interposed between the auxiliary common line 1010 and the common line 104. Further, the auxiliary common line 1010 and the common line 104 are configured to be electrically connected by a plurality of auxiliary common line contact-holes 1020.

The auxiliary common line 1010 and the anode line 106 may be made of the same metallic material and disposed under the rear surface of the gate line 108. Further, the auxiliary anode line 1016 and the common line 104 may be made of the same metallic material. But the present disclosure is not limited thereto.

The auxiliary common line 1010 may be configured to not overlap with at least two elements.

As a first example, the auxiliary common line 1010 may not overlap with the gate line 108. At the area where the gate line 108 is disposed, the patterned auxiliary common line 1010 is separated from each other by the gate line 108.

As a second example, the auxiliary common line 1010 may be configured to not overlap with the common line welding unit 650. At the area where the common line welding unit 650 is disposed, the patterned auxiliary common line 1010 is separated from each other by the common line welding unit 650.

The above-described configuration is advantageous for minimizing an increment of the parasitic capacitance even if the auxiliary common line 1010 is present because the auxiliary common line 1010 does not overlap with the gate line 108. Further, it is advantageous for exposing the laser to the common line welding unit 650 from under the first substrate 410 even if the auxiliary common line 1010 is disposed, as the auxiliary common line 1010 does not interrupt the laser exposure.

The auxiliary anode line 1016 and the anode line 106 may be configured to overlap with each other and extend along the same direction (the second direction). At least one insulation layer is configured to be interposed between the auxiliary anode line 1016 and the anode line 106. Further, the auxiliary anode line 1016 and the anode line 106 are configured to be electrically connected by a plurality of auxiliary common line contact holes 1020.

Further, the auxiliary anode line 1016 may be configured to not overlap with the gate line 108. At the area where the gate line 108 is disposed, the patterned auxiliary anode line 1016 may be separated from each other by the gate line 108.

The above-described configuration is advantageous for minimizing an increment of the parasitic capacitance even if the auxiliary anode line 1016 is present because the auxiliary anode line 1016 does not overlap with the gate line 108. Especially, the parasitic capacitance with respect to the gate line 108 can be minimized as the auxiliary common line 1010 and the auxiliary anode line 1016 are separated by the gate line 108.

In the above-described configuration, the common line 104 and the anode line 106 may be made of different metallic material. Such a case is advantageous because the design of the cathode voltage supply unit and the anode voltage supply unit at the periphery area is made easier when supplying the cathode voltage ELVSS and the anode voltage ELVSS from the periphery area around the pixel area AA, because the common line 104 and the anode line 106 can be electrically insulated from each other.

FIG. 11 is a schematic cross-sectional view illustrating an arrangement of a first sub-pixel circuit unit, a first sub-pixel electrode and a first color filter of the electro-luminescence display apparatus 1000.

The pixel circuit unit of the electro-luminescence display apparatus 1000 in comparison with the pixel circuit unit of the electro-luminescence display apparatuses 100 and 600 is characterized in that a light-shield capacitor electrode 1126 made of the same metallic material as the auxiliary common line 1010 is further included. Redundant features thereof are omitted for brevity and convenience of description.

The light-shield capacitor electrode 1126 is configured to be electrically connected to the source electrode 424, and a capacitor electrode 1125 electrically connected to the gate electrode 420 is configured to overlap with the light-shield capacitor electrode 1126 and the source electrode 424. That is, a first capacitance is generated at the overlapping area between the capacitor electrode 1125 and the light-shield capacitor electrode 1126 and a second capacitance is generated at the overlapping area between the capacitor electrode 1125 and the source electrode 424. Furthermore, the light-shield capacitor electrode 1126 may be extended to, and/or overlap with, the semiconductor layer 416 to protect the semiconductor layer 416 from ambient light. Moreover, a portion of the light-shield capacitor electrode 1126 can be further extended to the circumference of the boundary of the semiconductor layer 416.

The light-shield capacitor electrode 1126 and the source electrode 424 can be electrically connected by forming a contract-hole at the interlayer insulation layer 414 and the insulation buffer layer 412 disposed between the light-shield capacitor electrode 1126 and the source electrode 424.

The light-shield capacitor electrode 1126 may be a stacked structure including a copper layer having a thickness of about 6000 Å on an upper side and a molybdenum-titanium alloy layer having a thickness of about 300 Å on a lower side. But the present disclosure is not limited thereto. For example, the light-shield capacitor electrode 1126 and the source electrode 424 may have the same thickness.

According to yet another exemplary embodiment of the present disclosure, the capacitor electrode 1125 may be made of the semiconductor layer 416, having a conductive characteristic, and connected to the gate electrode 420 as illustrated in FIG. 11. But the present disclosure is not limited thereto, and the capacitor electrode 1125 may be configured as the capacitor electrode 425 of another exemplary embodiment of the present disclosure.

According to the above-described configuration, dual capacitance can be generated by the light-shield capacitor electrode 1126. Accordingly, the capacitance can be increased within a relatively small area. Consequently, it is advantageous for realizing a high resolution top-emission type electro-luminescence display apparatus, and for improving the efficiency of the manufacturing process, if the stacked structure and the thickness of the light-shield capacitor electrode 1126 and the source electrode 424 are the same as the light-shield capacitor electrode 1126, and the source electrode 424 can be manufactured by the same manufacturing process recipe. Moreover, it is advantageous for realizing a high resolution top-emission type electro-luminescence display apparatus if the capacitor electrode 1125 is made of the same material as the gate electrode 420 and/or the semiconductor layer 416 as the layout of the pixel circuit unit can be optimized.

FIG. 12 is a schematic cross-sectional view illustrating a structure of an auxiliary common line adjacent to a common line welding unit of an electro-luminescence display apparatus 1000.

In FIG. 12, for convenience of explanation, the auxiliary common line 1010, the common line welding unit 650 and various elements also illustrated in FIG. 10 are included. FIG. 12 corresponds to the cross-sectional line A-A' of FIG. 10. Redundant features thereof will be omitted for brevity and convenience of description The auxiliary common line 1010 may be configured to be disposed at the circumference of the common line welding unit 650. The insulation buffer layer 412 and the interlayer insulation layer 414 are interposed between the common line 104 and the auxiliary common line 1010. Further, the common line 104 and the auxiliary common line 1010 are configured to be electrically connected by a plurality of auxiliary common line contact-holes 1020 passing through the insulation buffer layer 412 and the interlayer insulation layer 414. Further, the auxiliary common line 1010 and the light-shield capacitor electrode 1126 may be made of the same metallic material. But the present disclosure is not limited thereto.

For example, the auxiliary common line 1010 may be a multilayered-structure including a copper layer having a thickness of about 6000 Å on a molybdenum-titanium alloy layer having a thickness of about 300 Å. But the present disclosure is not limited thereto.

The auxiliary common line 1010 may be configured to not overlap with the common line welding unit 650. That is, the auxiliary common line 1010 may be separated from each other by the common line welding unit 650.

According to the above-described configuration, the auxiliary common line 1010 does not interrupt the laser incident on the common line welding unit 650. Further, the line resistance value can be reduced as the auxiliary common line 1010 is electrically connected to the common line 104. Accordingly, the line width of the common line may be reduced. These features are advantageous for realizing a high resolution top-emission type electro-luminescence display apparatus.

In some embodiments, a portion of the auxiliary common line 1010 may be directly in contact with the common line welding unit. In such a case, the interlayer insulation layer 414 and the insulation buffer layer 412 disposed under the common line welding unit 650 may be removed, and a portion of the auxiliary common line 1010 may be patterned to be directly in contact with the common line welding unit 650. The above-described configuration can achieve similar effects as the connect electrode illustrated in FIG. 9. That is, the thermal energy generated by the laser can be stored in a portion of the auxiliary common line 1010 disposed under the common line welding unit 650. Accordingly, relatively more thermal energy can be concentrated in the laser welding area during the laser welding process. Thus, it is advantageous that the welding success rate can be increased and the temperature at the circumference of the welded area can be decreased.

Figure 13:
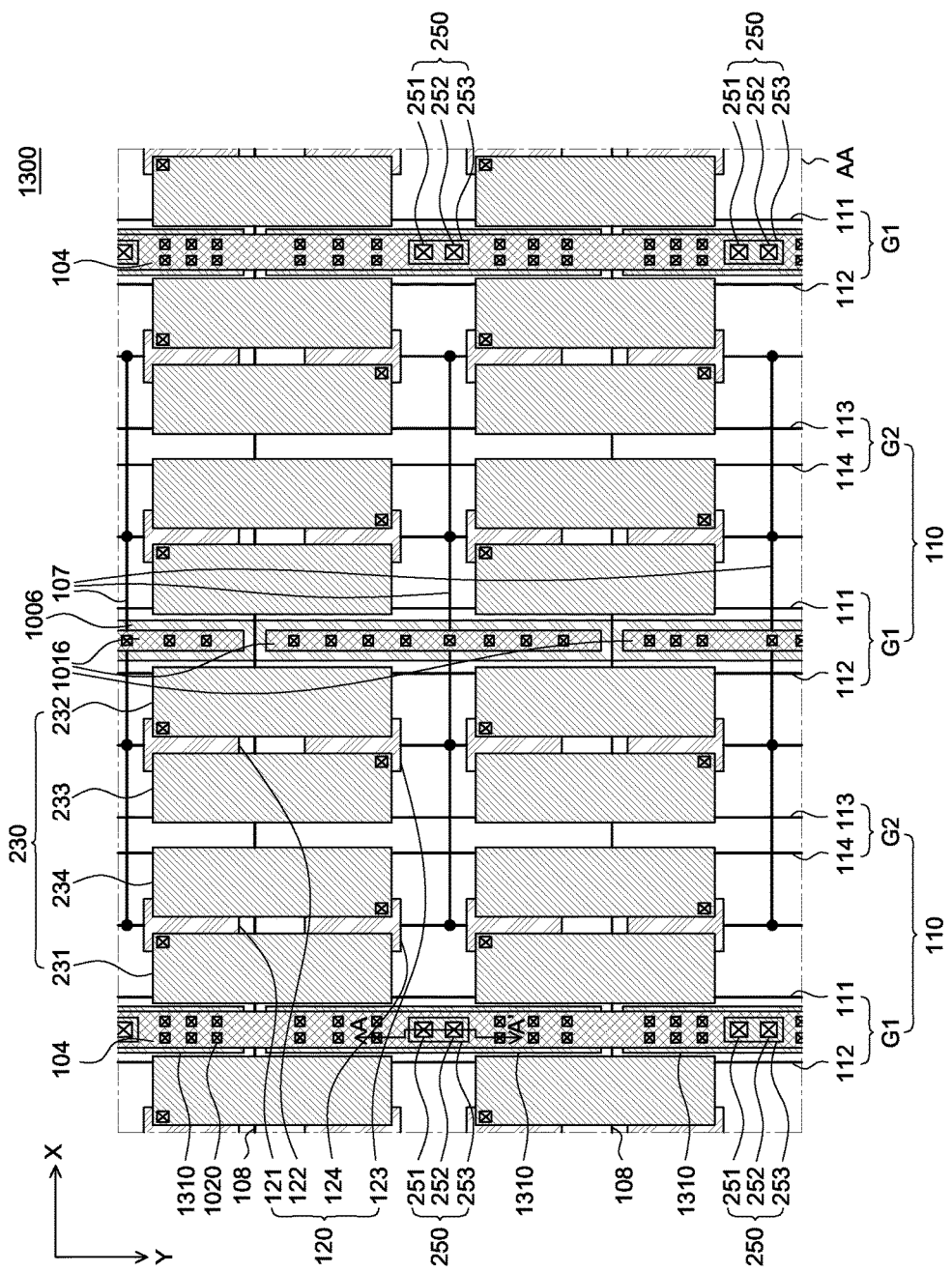
FIG. 13 is a schematic plan view illustrating an electro-luminescence display apparatus 1300 according to yet another exemplary embodiment of the present disclosure.
Figure 14:
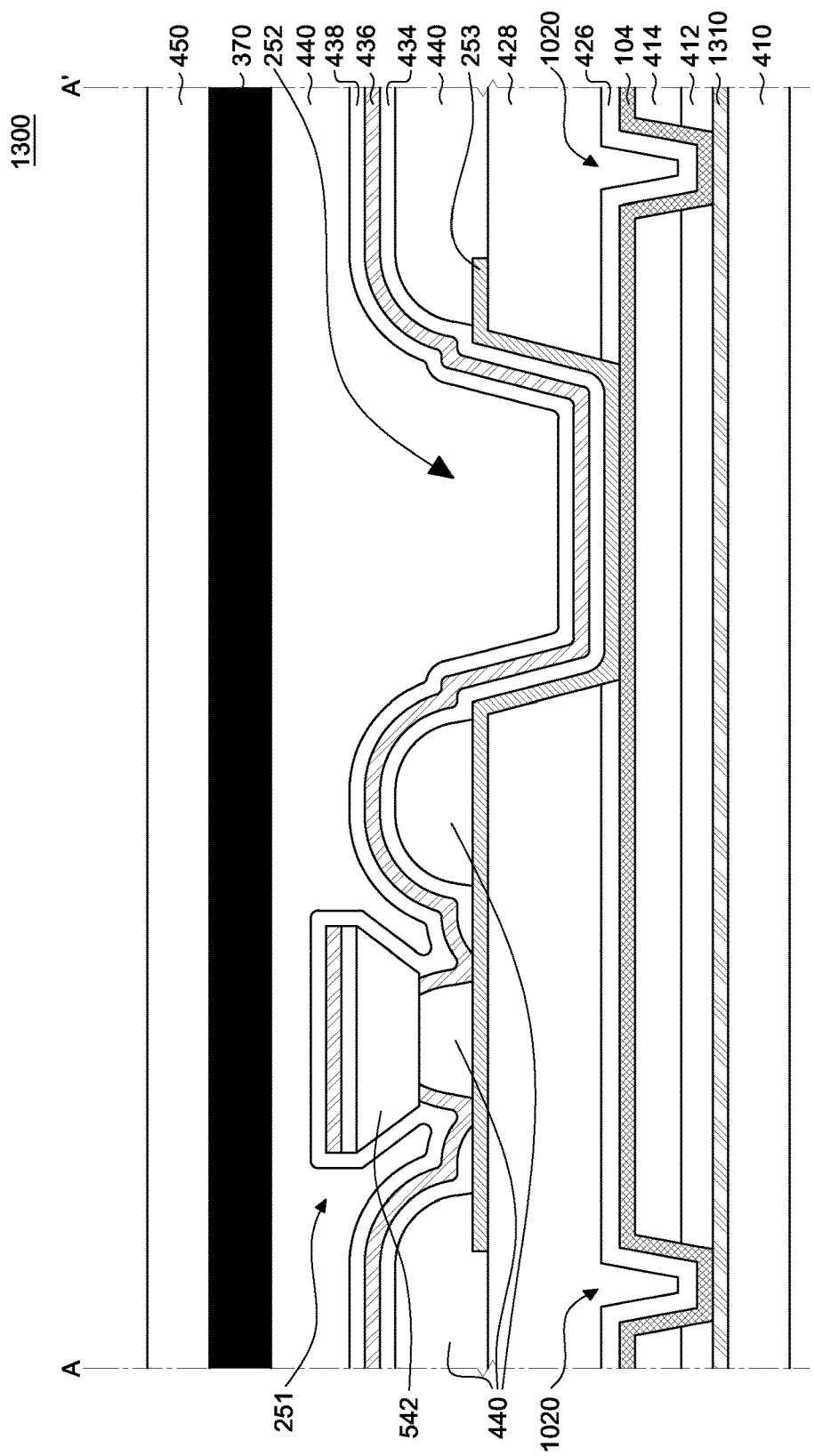
FIG. 14 is a schematic cross-sectional view illustrating a structure of an auxiliary common line adjacent to a common line contact unit of the electro-luminescence display apparatus illustrated in FIG. 13.

The electro-luminescence display apparatus 1300 according to yet another exemplary embodiment of the present disclosure is illustrated in FIG. 13 and FIG. 14.

FIG. 13 is a schematic plan view illustrating an electro-luminescence display apparatus 1300.

The electro-luminescence display apparatus 1300 in comparison with the electro-luminescence display apparatus 1000 is characterized in that the common line welding unit 650 is replaced by the common line contact unit 250. Redundant features thereof are omitted for brevity and convenience of description.

An auxiliary common line 1310 is configured to not overlap with the gate line 108, and to overlap with the common line contact unit 250.

FIG. 14 is a schematic cross-sectional view illustrating a structure of an auxiliary common line adjacent to a common line contact unit of an electro-luminescence display apparatus 1300. FIG. 14 corresponds to the cross-sectional line A-A' of FIG. 13. Redundant features thereof are omitted for brevity and convenience of description.

The common line contact unit 250 may be configured to overlap with the auxiliary common line 1310. The insulation buffer layer 412 and the interlayer insulation layer 414 are interposed between the common line 104 and the auxiliary common line 1310. Further, the common line 104 and the auxiliary common line 1010 are configured to be electrically connected by the plurality of auxiliary common line contact-holes 1020 passing through the insulation buffer layer 412 and the interlayer insulation layer 414.

The above-described configuration is advantageous for minimizing an increment of the parasitic capacitance even if the auxiliary common line 1310 is present because the auxiliary common line 1310 does not overlap with the gate line 108. Further, the line resistance value can be reduced as the common line 104 and the auxiliary common line 1310 may overlap with each other except at the intersection area of the gate line 108 and the auxiliary common line 1310. Accordingly, the line width of the common line 104 may be reduced. Thus, it is advantageous for realizing a high resolution top-emission type electro-luminescence display apparatus.

Figure 15:
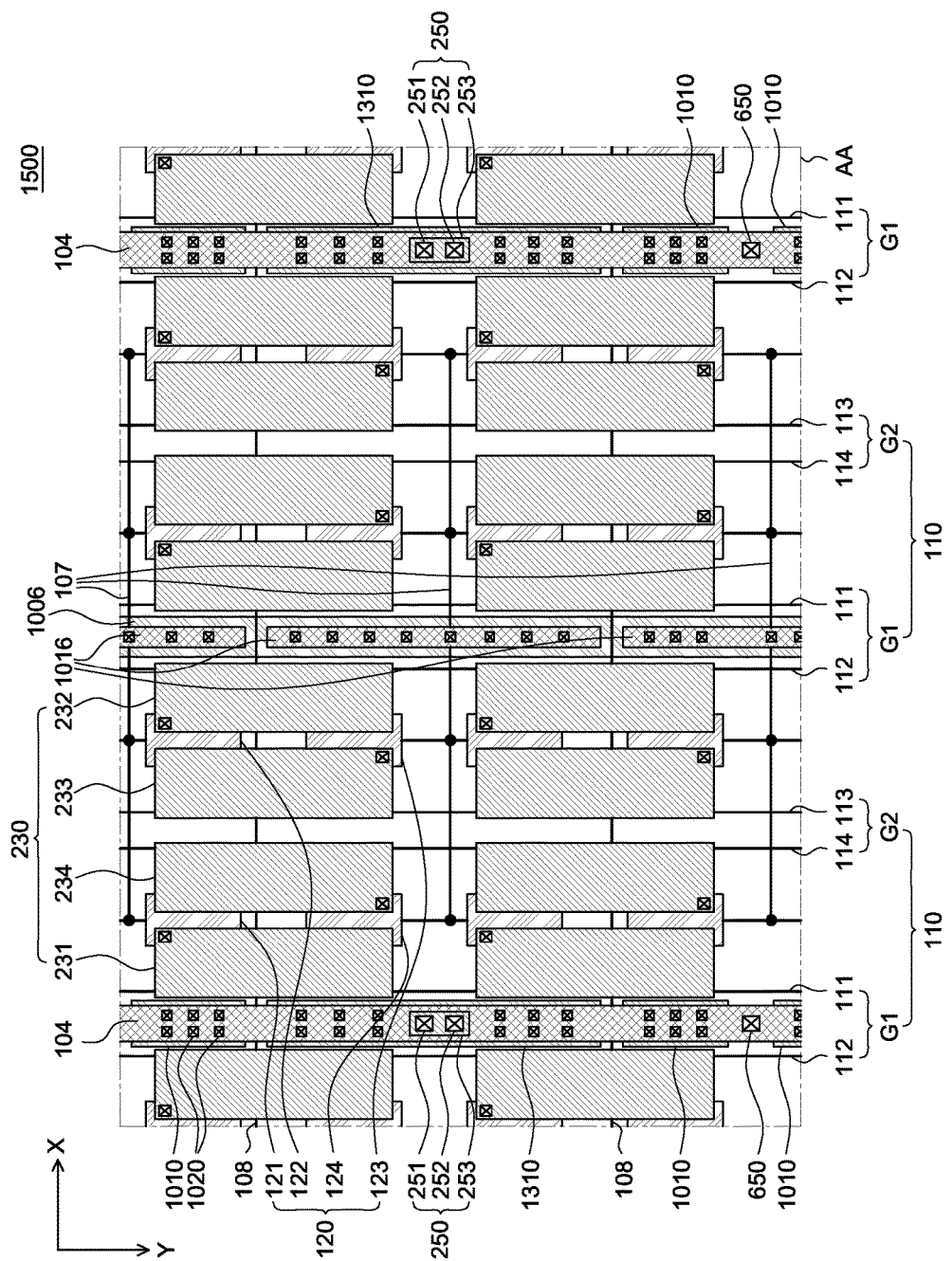
FIG. 15 is a schematic plan view illustrating an electro-luminescence display apparatus 1500 according to yet another exemplary embodiment of the present disclosure.

The electro-luminescence display apparatus 1500 according to yet another exemplary embodiment of the present disclosure is illustrated in FIG. 15.

The electro-luminescence display apparatus 1500 is characterized in that it includes the auxiliary common line 1010 and the common line welding unit 650 of the electro-luminescence display apparatus 1000 as well as the auxiliary common line 1310 and the common line contact unit 250 of the electro-luminescence display apparatus 1300. Redundant features thereof are omitted merely for brevity and convenience of description.

According to the above-described configuration, the number of common line welding units 650 can be reduced. Further, it is advantageous for reducing the thermal stress transferred to the electro-luminescence layer of the electro-luminescence display apparatus because a lower number of common line welding units 650 may result in less heat being generated by the laser during the manufacturing process of the electro-luminescence display apparatus.

In some embodiments, the common line welding unit 650 and the common line contact unit 250 can be alternatively disposed along the first direction on each common line 104.

Figure 16:
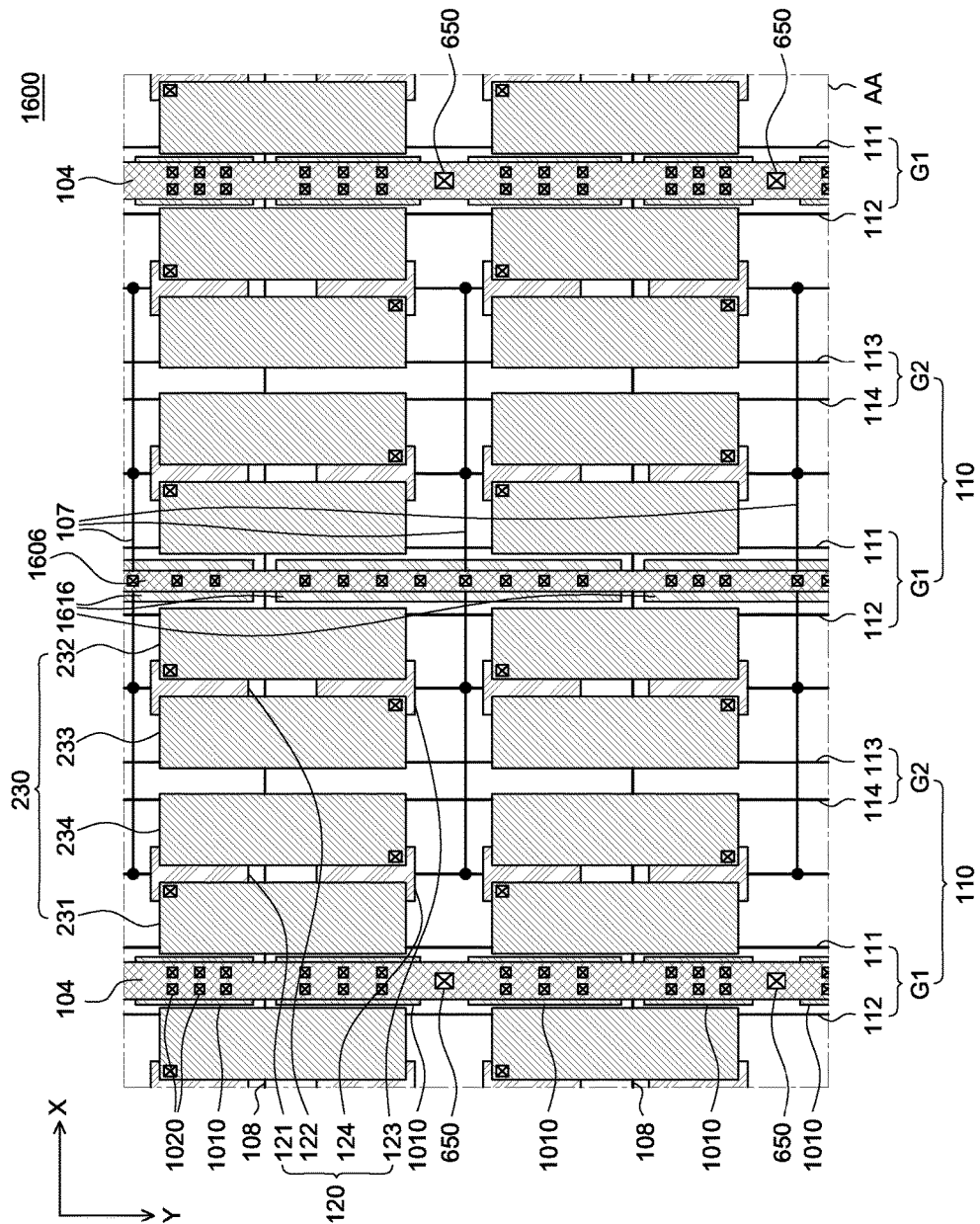
FIG. 16 is a schematic plan view illustrating an electro-luminescence display apparatus 1600 according to yet another exemplary embodiment of the present disclosure.

The electro-luminescence display apparatus 1600 according to yet another exemplary embodiment of the present disclosure is illustrated in FIG. 16.

The electro-luminescence display apparatus 1600 is characterized in that the position of an anode line 1606 and an auxiliary anode line 1616 of the electro-luminescence display apparatus 1600 are swapped with respect to the anode line 1006 and the auxiliary anode line 1016 of the electro-luminescence display apparatus 1000. Redundant features thereof are omitted merely for brevity and convenience of description.

As illustrated in FIG. 16, the position of the anode line 1606 and the auxiliary anode line 1616 may be swapped. But the present disclosure is not limiter thereto, and the position of the common line 104 and the auxiliary common line 1010 may be swapped. That is, the gate line 108 is configured to intersect with one of the anode line and the auxiliary anode line and the gate line 108 is configured to intersect with one of the common line and the auxiliary common line.

The above-described configuration is advantageous for minimizing the increment in parasitic capacitance even if the auxiliary anode line and the auxiliary common line are present because they may be not overlap with the gate line 108.

Figure 17:
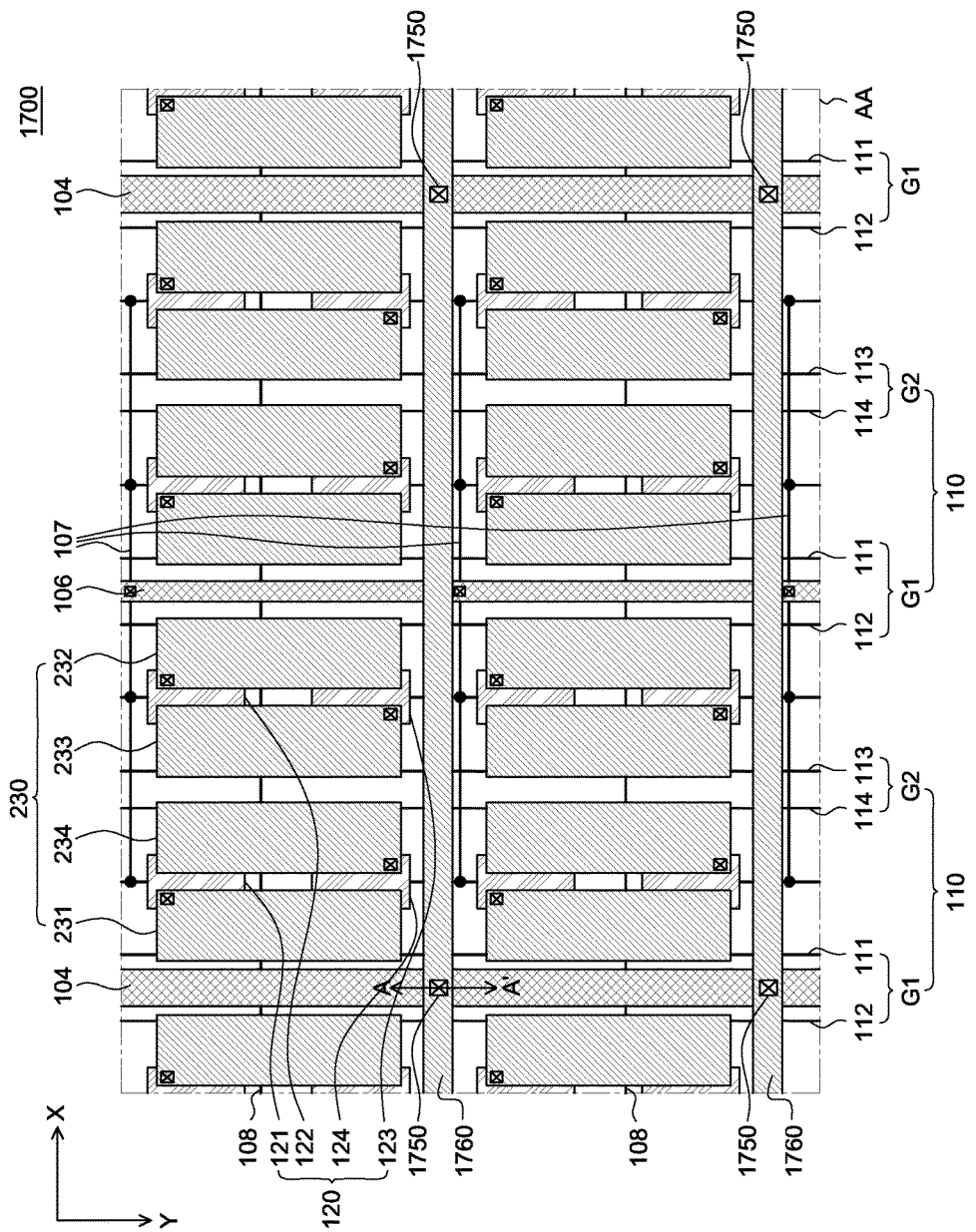
FIG. 17 is a schematic plan view illustrating an electro-luminescence display apparatus 1700 according to yet another exemplary embodiment of the present disclosure.
Figure 18:
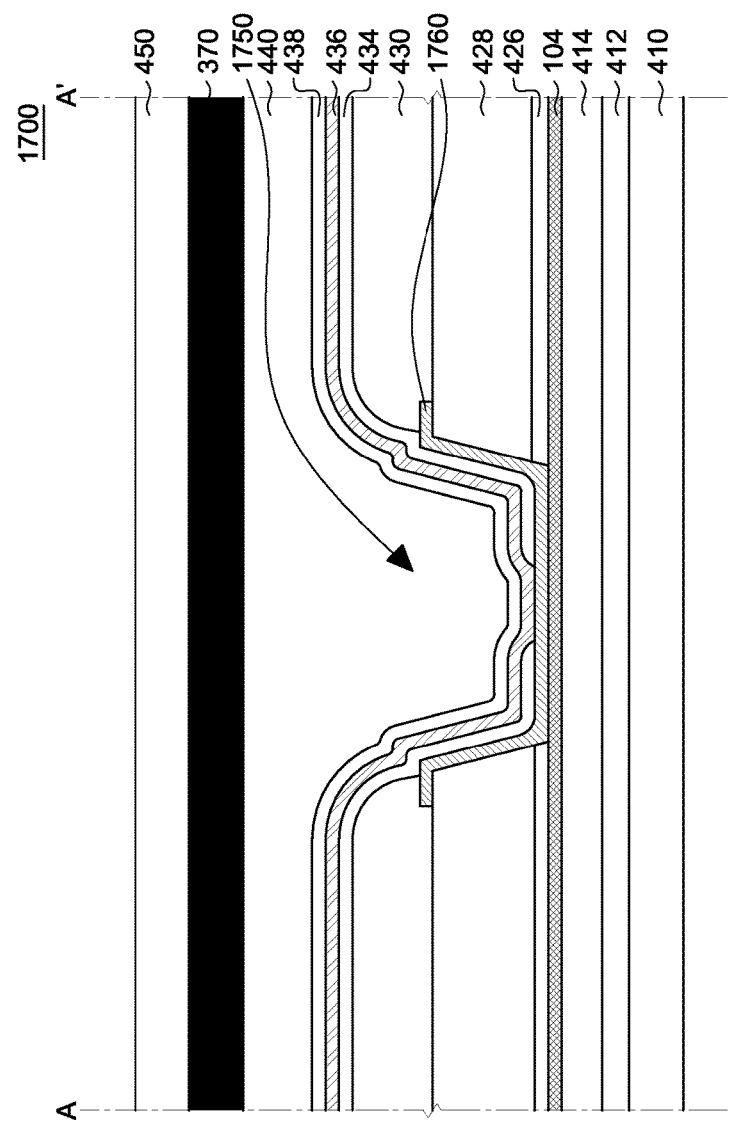
FIG. 18 is a schematic cross-sectional view illustrating a common line welding unit of the electro-luminescence display apparatus illustrated in FIG. 17.

The electro-luminescence display apparatus 1700 according to yet another exemplary embodiment of the present disclosure is illustrated in FIG. 17 and FIG. 18.

The electro-luminescence display apparatus 1700 is characterized in that the apparatus further includes a pixel electrode common line 1760 extending along the first direction. The pixel electrode common line 1760 may be made of the same material as the connect electrode 253 and/or the pixel electrode 230. Redundant features thereof are omitted merely for brevity and convenience of description.

FIG. 18 is a schematic cross-sectional view illustrating a common line welding unit of an electro-luminescence display apparatus 1700. FIG. 18 corresponds to the cross-sectional line A-A' of FIG. 17.

The cross-sectional structure of the common line welding unit 1750, as illustrated in FIG. 18, is substantially the same cross-sectional structure of the common line welding unit 850 as illustrated in FIG. 8. Redundant features thereof are omitted merely for brevity and convenience of description.

According to the above-described configuration, the pixel electrode common line 1760 can electrically connect the common lines 104 which are spaced apart from each other. Further, it is advantageous for reducing the degree of the line resistance deviation of the common lines by the pixel electrode common line 1760 even if each of the common lines 104 may have a line resistance deviation caused by variations in width and/or thickness of the common lines 104. Additionally, it is advantageous that the space (i.e., a gap) between the pixel electrodes 230 disposed along the second direction can be utilized and the uniformity of cathode voltage ELVSS can be improved.

Figure 19:
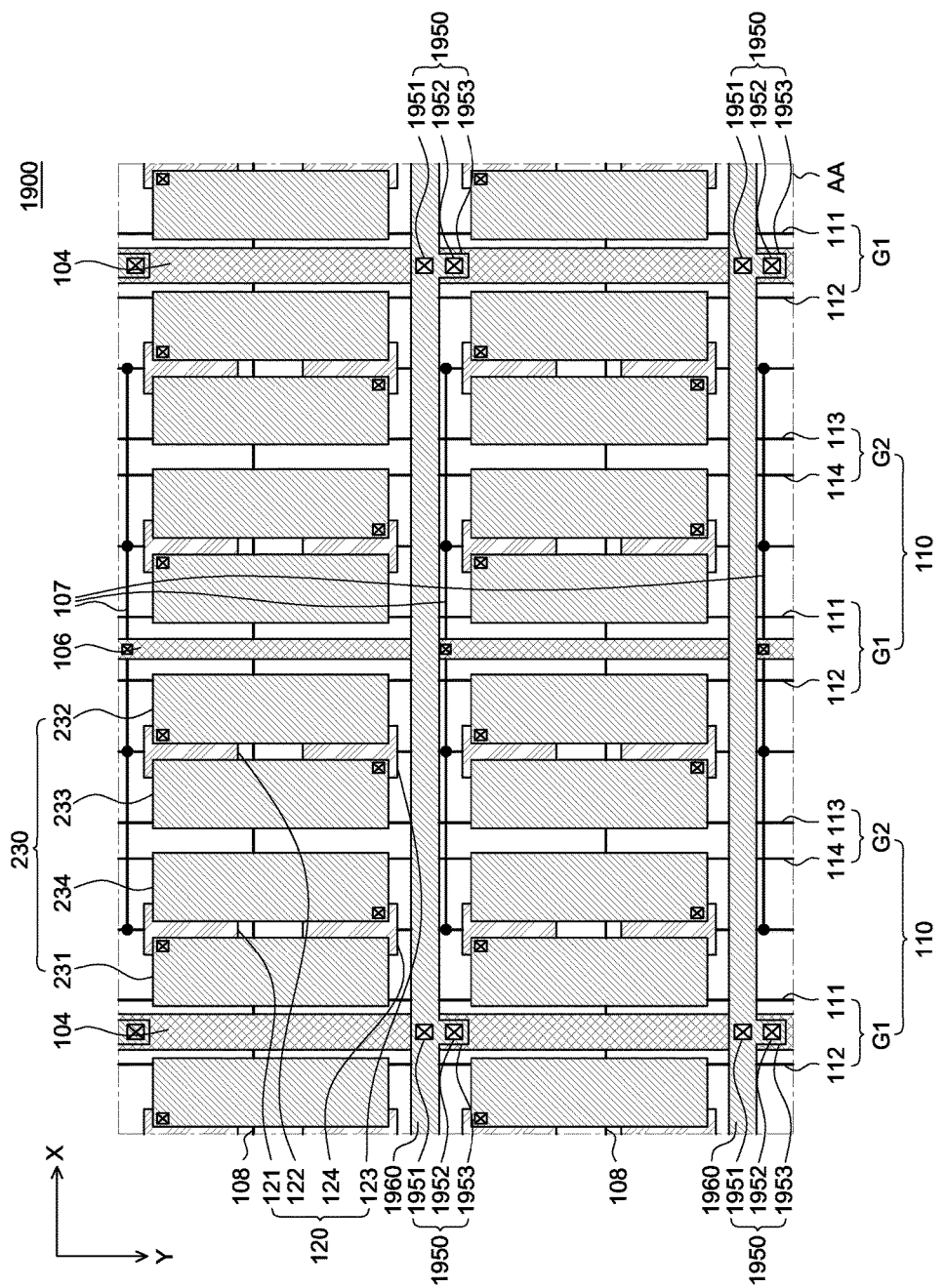
FIG. 19 is a schematic plan view illustrating an electro-luminescence display apparatus 1900 according to yet another exemplary embodiment of the present disclosure.

The electro-luminescence display apparatus 1900 according to yet another exemplary embodiment of the present disclosure is illustrated in FIG. 19.

The structure of the common line contact unit 1950 of the electro-luminescence display apparatus 1900 is configured to be substantially similar to the common line contact unit 250 as illustrated in FIG. 2. That is, the structure of the exposed electro-luminescence layer part 1951 may be configured to be substantially similar to the structure of the exposed electro-luminescence layer part 251; the structure of the common line contact unit contact-hole 1952 may be configured to be substantially similar to the structure of the common line contact unit contact-hole 252; the structure of the connect electrode 1953 may be configured to be substantially similar to the structure of the connect electrode 253; the connect electrode 1953 may be made of the same metallic material of the pixel electrode common line 1960 extending along the first direction; the structure of the pixel electrode common line 1960 may be configured to be substantially similar to the structure of the pixel electrode common line 1760; and the connect electrode 1953 may be configured to be directly in contact with the pixel electrode common line 1760. Otherwise, a portion of the connect electrode 1953 may be extended to configure the pixel electrode common line 1760.

According to the above-described configuration, the pixel electrode common line 1960 can electrically connect the common lines 104 which are spaced apart from each other. This structure is advantageous for reducing the degree of a line resistance deviation of the common lines by the pixel electrode common line 1960 even if each of the common lines 104 may have a line resistance deviation caused by variations in width and/or thickness of the common lines 104. Additionally, it is advantageous that the space (i.e., a gap) between the pixel electrodes 230 disposed along the second direction can be utilized and the uniformity of cathode voltage ELVSS can be improved.

Figure 20:
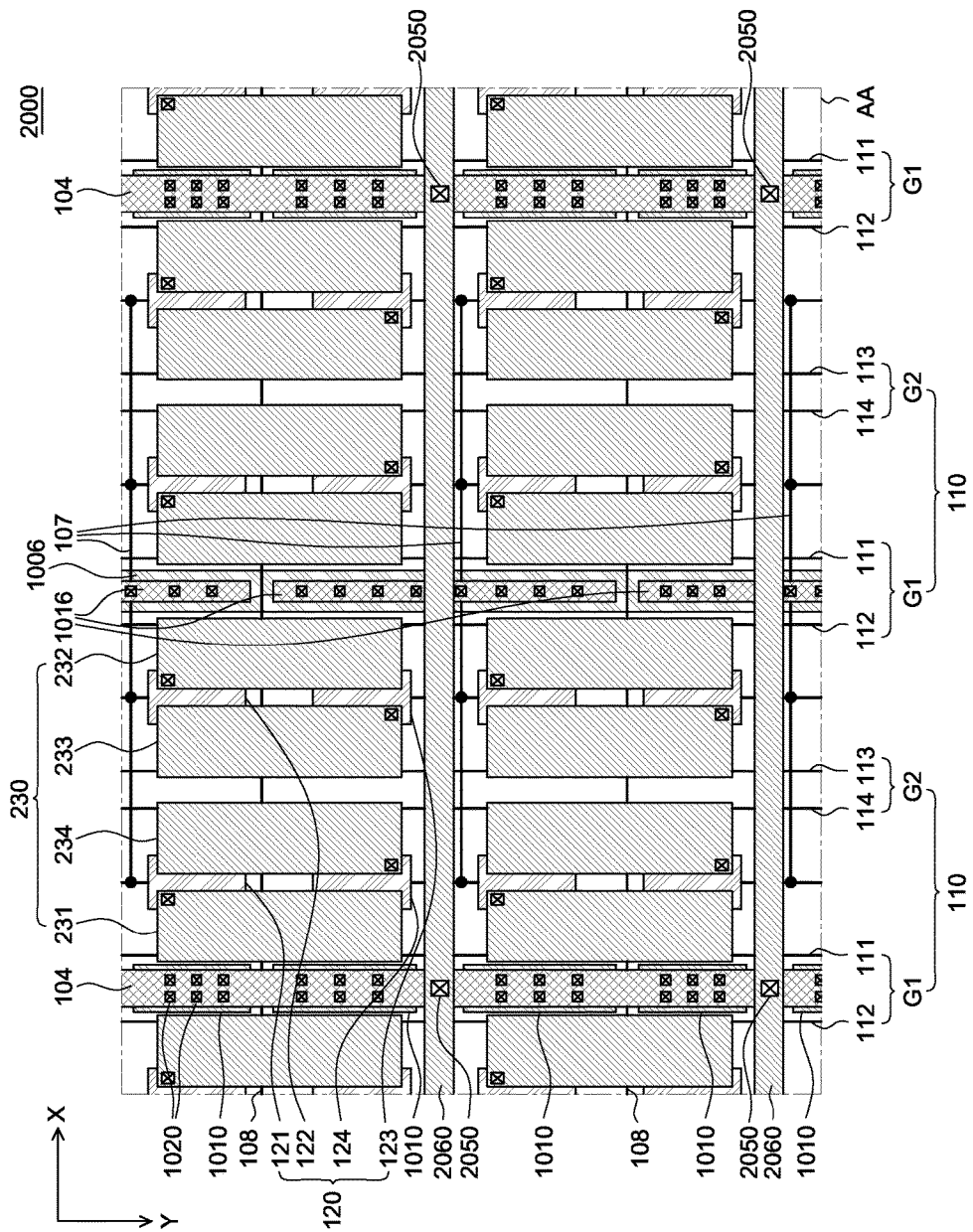
FIG. 20 is a schematic plan view illustrating an electro-luminescence display apparatus 2000 according to yet another exemplary embodiment of the present disclosure.

The electro-luminescence display apparatus 2000 according to yet another exemplary embodiment of the present disclosure is illustrated in FIG. 20.

The structure of the common line welding unit 2050 of the electro-luminescence display apparatus 2000 as illustrated in FIG. 20 may be configured to be substantially similar to the common line welding unit 1750 as illustrated in FIG. 17; and the structure of the pixel electrode common line 2060 may be configured to be substantially similar to the pixel electrode common line 1760. Furthermore, the auxiliary common line 1010 and the auxiliary anode line 1016 may be included in this structure.

According to the above-described configuration, the pixel electrode common line 2060 can electrically connect the common lines 104 which are spaced apart from each other. Further, it is advantageous for reducing the degree of a line resistance deviation of the common lines by the pixel electrode common line 2060 even if each of the common lines 104 may have a line resistance deviation caused by variations in width and/or thickness of the common lines 104. Furthermore, according to the arrangement of the auxiliary common line 1010 and the auxiliary anode line 1016, the uniformity of cathode voltage ELVSS can be improved.

Figure 21:
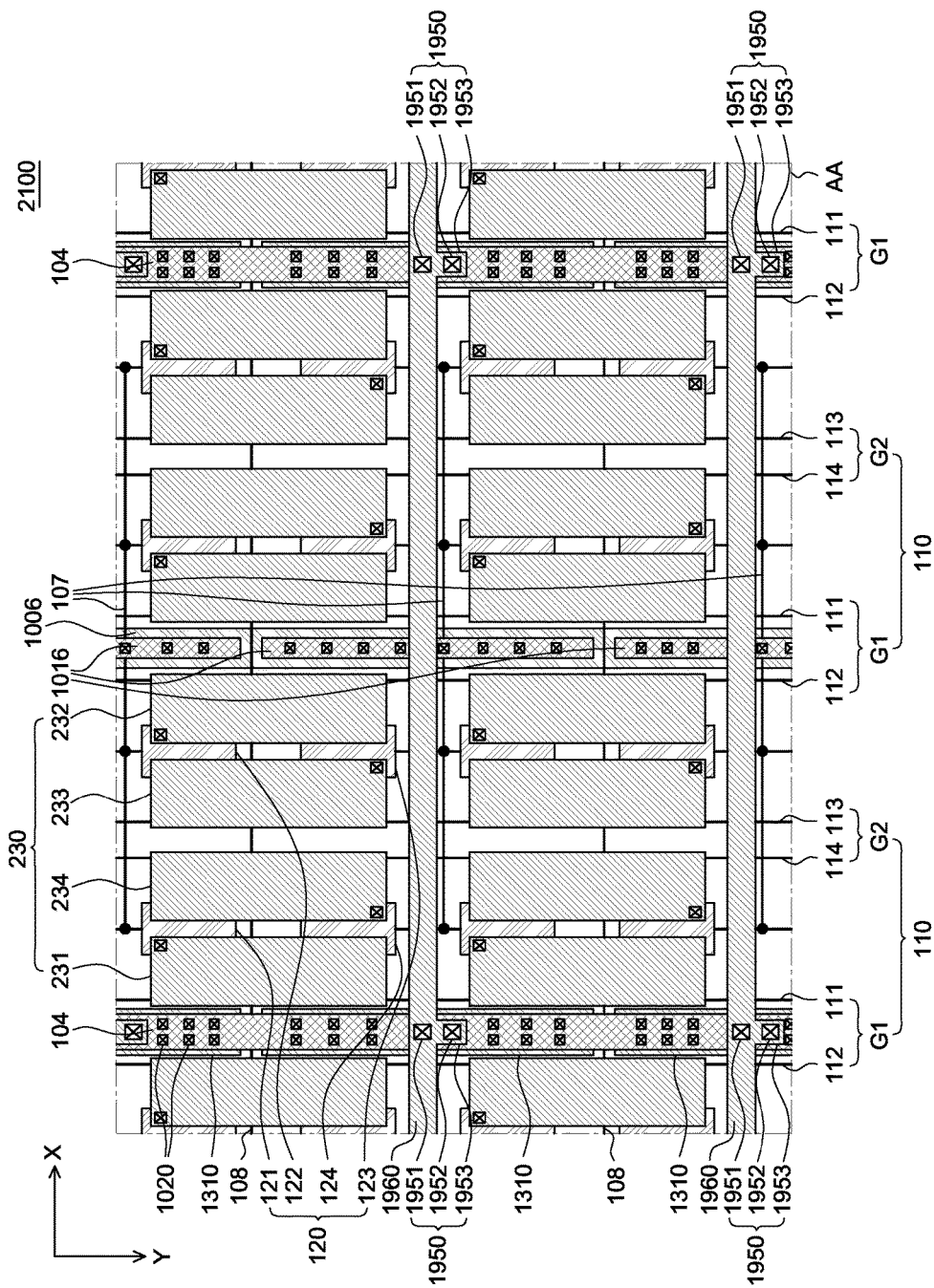
FIG. 21 is a schematic plan view illustrating an electro-luminescence display apparatus 2100 according to yet another exemplary embodiment of the present disclosure.

The electro-luminescence display apparatus 2100 according to yet another exemplary embodiment of the present disclosure is illustrated in FIG. 21.

The common line contact unit 1950 of the electro-luminescence display apparatus 2100 as illustrated in FIG. 21 is substantially the same as the common line contact unit 1950 as illustrated in FIG. 19. Further, the pixel electrode common line 1960 may be configured to be substantially similar to the pixel electrode common line 1760 as illustrated in FIG. 17. Furthermore, the auxiliary common line 1310 and the auxiliary anode line 1016 may be included in this structure.

According to the above-described configuration, the pixel electrode common line 1960 can electrically connect the common lines 104 which are spaced apart from each other. Further, it is advantageous for reducing the degree of the line resistance deviation of the common lines by the pixel electrode common line 1960 even if each of the common lines 104 may have a line resistance deviation caused by variations in width and/or thickness of the common lines 104. Furthermore, according to the arrangement of the auxiliary common line 1310 and the auxiliary anode line 1016, the uniformity of cathode voltage ELVSS can be improved.

Figure 22:
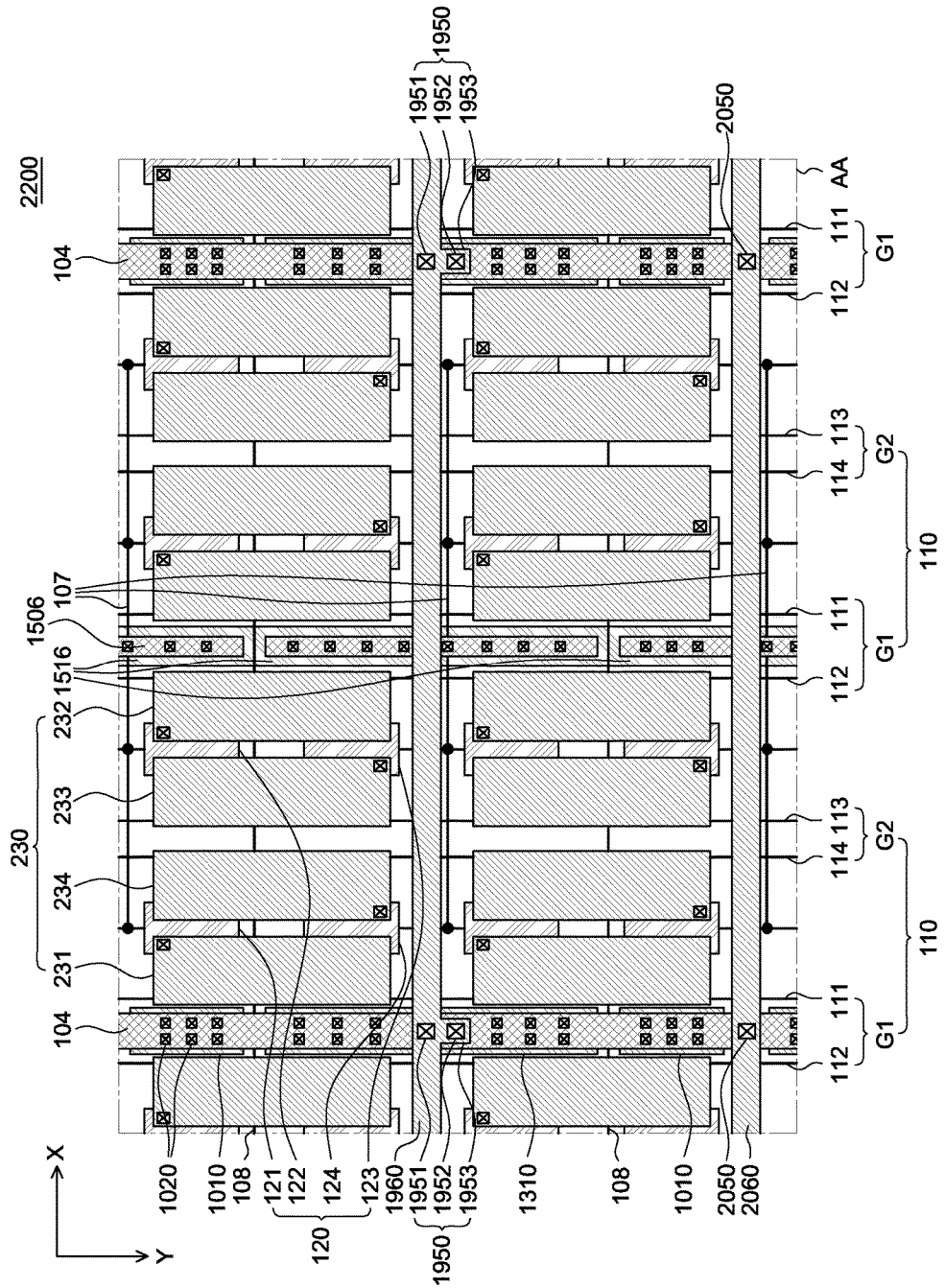
FIG. 22 is a schematic plan view illustrating an electro-luminescence display apparatus 2200 according to yet another exemplary embodiment of the present disclosure.

The electro-luminescence display apparatus 2200 according to yet another exemplary embodiment of the present disclosure is illustrated in FIG. 22.

The common line welding unit 2050 of the electro-luminescence display apparatus 2200 is substantially the same as the common line welding unit 2050 as illustrated in FIG. 20. Further, the common line contact unit 1950 as illustrated in FIG. 22 is substantially the same as the common line contact unit 1950 as illustrated in FIG. 21.

According to the above-described configuration, the pixel electrode common line 2060 can electrically connect the common lines 104 which are spaced apart from each other. Further, it is advantageous for reducing the degree of the line resistance deviation of the common lines by the pixel electrode common line 2060 even if each of the common lines 104 have a line resistance deviation caused by variations in width and/or thickness of the common lines 104. Furthermore, according to the arrangement of the auxiliary common lines 1010 and 1310 and the auxiliary anode line 1016, the uniformity of cathode voltage ELVSS can be improved.

In some embodiments, on the pixel electrode common line 1960, the common line contact unit 1950 and the common line welding unit 2050 may be alternatively disposed along the first direction.

In some embodiments, the common line welding unit 2050 and the common line contact unit 1950 may be alternatively disposed along the first direction on the pixel electrode common line 2060.

Figure 23:
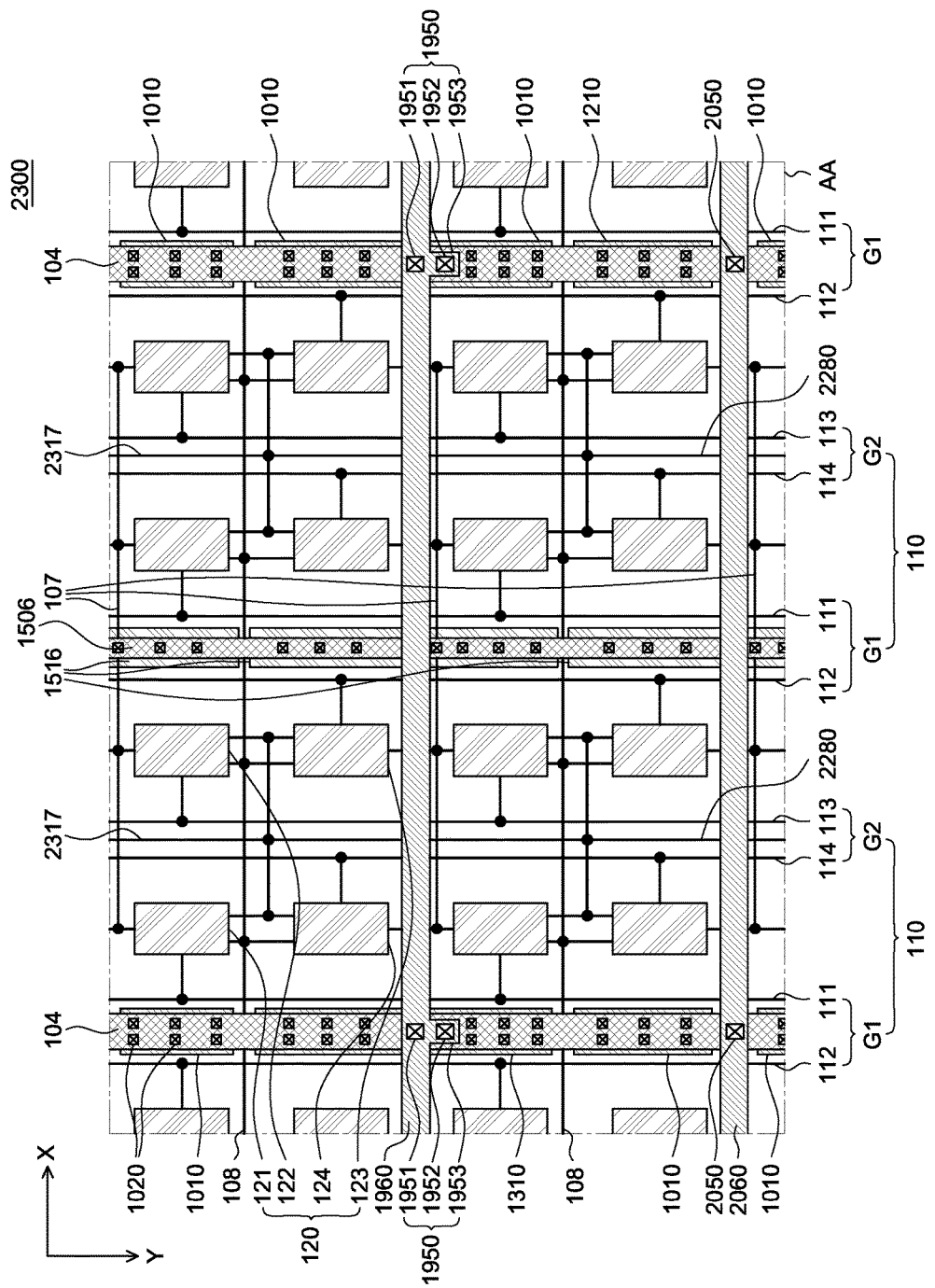
FIG. 23 is a schematic plan view illustrating an electro-luminescence display apparatus 2300 according to yet another exemplary embodiment of the present disclosure.

The electro-luminescence display apparatus 2300 according to yet another exemplary embodiment of the present disclosure is illustrated in FIG. 23.

In FIG. 23, the pixel electrode 230 is omitted for convenience of description. The electro-luminescence display apparatus 2300 is characterized in that an additional line is disposed within the second data line group G2.

A reference voltage line 2317, capable of compensating a threshold voltage (Vth) of the driving transistor of the pixel circuit unit 120, is disposed within the second data line group G2. Further, the reference voltage line 2317 is configured to be electrically connected to the corresponding first sub-pixel circuit unit 121, second sub-pixel circuit unit 122, third sub-pixel circuit unit 123, and fourth sub-pixel circuit unit 124 of the pixel circuit unit 120, respectively. That is, the reference voltage line 2317 may function as a compensation circuitry. The reference voltage line 2317 may be connected to a data driver in the periphery area around the pixel area. The data driver may be configured to compensate for the threshold voltage deviation of the driving transistor by detecting the voltage transferred from the reference voltage line 2317. But the present disclosure is not limited thereto. In other words, every embodiment of the present disclosure may be configured to arrange a functional line within the second data line group G2.

In some exemplary embodiments, a touch sensing line, configured to sense a touch, may be disposed within the second data line group G2. The touch sensing line may be connected to an electrode configured to sense capacitance or pressure.

In other exemplary embodiments, a line for an added-function may be disposed within the second data line group G2.

In some exemplary embodiments, a plurality of lines for realizing mutually different functions may be disposed within the second data line group G2. For example, a reference voltage line and a touch sensing line may extend along the second direction, spaced apart from each other, and may be disposed between the third data line 113 and the fourth data line 114 of the second data line group G2.

In other exemplary embodiments, if a plurality of mutually different functional lines are disposed within the second data line group G2, each of the mutually different functional lines may be made of at least one metallic material as the metal layer of the common line and the metal layer of the auxiliary common line.

In still other exemplary embodiments, at least two different mutually different functional lines are disposed within the second data line group G2. Further, among the at least two different mutually different functional lines, one line may be made of the same metallic material as the common line and another line may be made of the same metallic material as the auxiliary common line. Furthermore, such at least two lines are insulated from each other by an insulation layer. Moreover, they may overlap with each other.

In some exemplary embodiments, the common line 104 may be disposed within the first line group G1 or second line group G2. The anode line 106 may be disposed within the first line group G1 or the second line group G2. In other words, a line group is capable of providing a room for at least one signal line extending in parallel with the line group, wherein the at least one signal line is disposed within the line group.

In some exemplary embodiments, an electro-luminescence display apparatus may comprises at least one quad-type pixel circuit unit comprising a plurality of sub-pixel circuit units; at least one gate line disposed between the plurality of sub-pixel circuit units and extending along a first direction; at least one first data line group comprising a first pair of data lines disposed at both sides of the at least one quad-type pixel circuit unit and extending along a second direction; at least one second data line group comprising a second pair of data lines disposed between the sub-pixel circuit units and extending along the second direction; and at least one common line and at least one anode line disposed between the first pair of data lines of the first data line group and disposed along the first direction, and wherein the at least one gate line crosses with the at least one first data line group and the at least one second data line group.

In some exemplary embodiments, the electro-luminescence display apparatus may further comprise an overcoat insulation layer on the at least one quad-type pixel circuit unit and the at least one common line; a pixel electrode on the overcoat insulation layer; an electro-luminescence layer on the pixel electrode; and a common electrode on the electro-luminescence layer, wherein the common electrode is electrically connected to the at least one common line at an area where the electro-luminescence layer is not disposed.

In some exemplary embodiments, the electro-luminescence display apparatus may further comprise at least one of a common line contact unit and a common line welding unit configured to electrically connect the common electrode and the at least one common line.

In some exemplary embodiments, the common line welding unit may be configured such that the common electrode is welded to the at least one common line at an area where the electro-luminescence layer is removed by a laser.

In some exemplary embodiments, the electro-luminescence display apparatus may further comprise a common line contact unit and a common line welding unit, wherein the common line contact unit and the common line welding unit are alternatively disposed along the second direction.

In some exemplary embodiments, the electro-luminescence display apparatus may further comprise at least one auxiliary common line overlapping with the at least one common line, and separated from the at least one common line along the second direction at a crossing of the at least one common line and the at least one gate line, wherein the at least one auxiliary common line is electrically connected to the at least one common line, and the at least one auxiliary common line is electrically insulated from the at least one gate line.

In some exemplary embodiments, the electro-luminescence display apparatus may further comprise a light-shield capacitor electrode, wherein a material of the light-shield capacitor electrode is the same as a metallic material of the at least one auxiliary common line, and wherein the light-shield capacitor electrode is configured to shield a driving transistor of the at least one sub-pixel circuit unit from light; and an insulation buffer layer between the at least one common line and the at least one auxiliary common line.

In some exemplary embodiments, the at least one auxiliary common line may be separated from the common line welding unit along the second direction, and is configured to not overlap with the common line welding unit.

In some exemplary embodiments, the electro-luminescence display apparatus may further comprise at least one auxiliary anode line overlapping with the at least one anode line, and separated from the at least one auxiliary anode line along the second direction at a crossing of the at least one anode line and the at least one gate line, and the at least one auxiliary anode line may be electrically connected to the at least one common line, and the insulation buffer layer may be between the at least one anode line and the at least one auxiliary anode line.

In some exemplary embodiments, both the at least one common line and the at least one anode line may comprise a first metallic material, and both the at least one auxiliary common line and the at least one auxiliary anode line may comprise a second metallic material, and the second metallic material may be different from the first metallic material.

In some exemplary embodiments, both the at least one common line and the at least one auxiliary anode line may comprise a first metallic material, and both the at least one auxiliary common line and the at least one anode line may comprise a second metallic material, and the second metallic material may be different from the first metallic material.

In some exemplary embodiments, the electro-luminescence display apparatus may further comprise a connect electrode disposed between the at least one common line and the common electrode, wherein the connect electrode may be configured to electrically connect the at least one common line and the common electrode, wherein the connect electrode and the pixel electrode may comprise a first metallic material, and wherein the connect electrode may be configured to overlap with at least one of the common line contact unit and the common line welding unit.

In some exemplary embodiments, the common line welding unit may be configured such that the connect electrode is welded to the at least one common line at an area where the electro-luminescence layer is removed by a laser.

In some exemplary embodiments, the electro-luminescence display apparatus may further comprise a pixel electrode common line configured to electrically connect a plurality of common lines, wherein the pixel electrode common line may be disposed between the pixel electrodes and extends along the first direction, wherein the pixel electrode common line may be directly in contact with the connect electrode, and wherein the pixel electrode common line and the connect electrode may comprise a same metallic material.

In some exemplary embodiments, the common line contact unit may comprise a structure having a reverse-tapered shape, an exposed electro-luminescence layer part overlapping with the connect electrode, and a common line contact unit contact-hole overlapping with the connect electrode.

In some exemplary embodiments, the electro-luminescence display apparatus may further comprise at least one functional line between the second pair of data lines of the second data line group.

In some exemplary embodiments, an electro-luminescence display apparatus may comprise a plurality of sub-pixel circuit units arranged in a matrix form; at least one gate line disposed between the plurality of sub-pixel circuit units and extending along a first direction; a plurality of first data line groups and a plurality of second data line groups alternatively disposed between the plurality of sub-pixels circuit units and extending along a second direction; a plurality of common lines disposed within the first or the second data line groups and extending along the second direction; and a plurality of anode lines disposed within the first or the second data line groups and extending along the second direction.

In some exemplary embodiments, the plurality of common lines may be disposed within the plurality of the first data line groups and the plurality of anode lines may be disposed within the plurality of the second data line groups.

In some exemplary embodiments, the plurality of common lines may be disposed within the plurality of the second data line groups and the plurality of anode lines may be disposed within the plurality of the first data line groups.

In some exemplary embodiments, both of the plurality of common lines and the plurality anode lines may be disposed within the first or the second data line groups.

In some exemplary embodiments, a space of the first data line groups and a space of the second data line groups may be determined according to a width of a signal line disposed therein.

In some exemplary embodiments, the width of the common line may be wider than the width of the anode line, and the space of the first or the second data line group containing the common line may be larger than the space of the first or the second data line group containing the anode line.

In some exemplary embodiments, the electro-luminescence display apparatus may further comprise an auxiliary common line overlapping with the common line and an auxiliary anode line overlapping with the anode line.

In some exemplary embodiments, one line among the common line and the auxiliary common line may be formed of a solid signal line, and another line among the common line and the auxiliary common line may be formed of a plurality of island electrodes.

In some exemplary embodiments, the electro-luminescence display apparatus may further comprise a plurality of sub-pixel electrodes electrically connected to the plurality of sub-pixel circuit units; and a plurality of pixel electrode common lines configured to electrically interconnect the plurality of the common lines and extending along the first direction, wherein the plurality of sub-pixel electrodes may be in a shape having a wider width along the second direction than the first direction, and wherein the plurality of sub-pixel electrode and the plurality of pixel electrode common lines may be alternatively disposed along the second direction.

In some exemplary embodiments, an apparatus may comprise an array of pixels, each pixel having four sub-pixels configured for a top-emission electro-luminescence display apparatus, each sub-pixel having a sub-pixel electrode and a sub-pixel circuit unit connected to said sub-pixel electrode, such that each pixel has four sub-pixel circuit units; said four sub-pixel circuit units arranged in a 2×2 matrix having first and second sub-pixel circuit units forming an upper pair and third and fourth sub-pixel circuit units forming an lower pair; a gate line passing between said upper and lower pairs of sub-pixel circuit units in the row direction and electrically connected to said four sub-pixel circuit units, respectively; a first data line passing along said first and fourth sub-pixel circuit units in the column direction and electrically connected to said first sub-pixel circuit unit; a second data line passing along said second and third sub-pixel circuit units in the column direction and electrically connected to said second sub-pixel circuit unit; and third and fourth data lines passing between said first and second sub-pixel circuit units and between said third and fourth sub-pixel circuit units in the column direction and electrically connected to said third and fourth sub-pixel circuit unit, respectively.

In some exemplary embodiments, the apparatus may further comprise an anode line passing between adjacent sub-pixel circuit units in the column direction; and an extension unit extending in the row direction and electrically interconnecting said anode line to third and fourth sub-pixel circuit units of one pixel and to first and second circuit units of a different pixel adjacent to said one pixel in the column direction.

In some exemplary embodiments, the apparatus may further comprise at least one signal line extending along the column direction, and interposed in a first region between a first data line of one pixel and a second data line of different pixel adjacent to said one pixel in the row direction, interposed in a second region between third and fourth data lines of one pixel, or interposed in both said first and second regions.

In some exemplary embodiments, said at least one signal line may be at least one among a common line, an anode line, a reference voltage line, a touch sensing line, an external compensation line, a discharge line and an initial line.

In some exemplary embodiments, said first regions of said array of pixels may have said common line or said anode line in alternating manner.

In some exemplary embodiments, said first region has said common line and said second region may have said anode line.

In some exemplary embodiments, an electro-luminescence display apparatus may comprise a pixel circuit unit comprising a plurality of quad-type sub-pixel circuit units; a gate line disposed between the plurality of sub-pixel circuit units and extending along a first direction; a first data line group comprising a first pair of data lines disposed at both sides of the pixel circuit unit and extending along a second direction; a second data line group comprising a second pair of data lines disposed between the sub-pixel circuit units and extending along the second direction; a pixel electrode on the overcoat insulation layer; a common line and an anode line disposed between the first pair of data lines of the first data line group and disposed along the first direction; an overcoat insulation layer on the at least one pixel circuit unit and the at least one common line; and, a pixel electrode common line disposed between a plurality of pixel electrodes and extending along the first direction, wherein the pixel electrode common line electrically may connect a plurality of common lines, and wherein the gate line may cross with the first data line group and the second data line group.

In some exemplary embodiments, the electro-luminescence display apparatus further comprise a connect electrode disposed between the common line and the common electrode, and wherein the pixel electrode common line may be directly in contact with the connect electrode.

In some exemplary embodiments, the pixel electrode common line may comprise the same material as the connect electrode.

In some exemplary embodiments, the pixel electrode common line may comprise the same material as the pixel electrode.

In some exemplary embodiments, the electro-luminescence display apparatus may further comprise an auxiliary common line and an auxiliary anode line.

According to the above-described configurations, at least one functional line can be disposed within the second data line group G2, and the uniformity of brightness of the electro-luminescence display apparatus may increase. Further, it is advantageous that various functions may be readily provided because an additional line (e.g., a touch sensing line) may be readily disposed within the second data line group G2.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purpose only but are not intended to limit the technical concept of the present disclosure. The scope of the technical concept of the present disclosure is not limited thereto. The protective scope of the present disclosure should be construed based on the following claims and all the technical concepts in the equivalent scope thereof should be construed as falling within the scope of the present disclosure.

What is claimed is:

1. An electro-luminescence display apparatus comprising:
at least one quad-type pixel circuit unit comprising a plurality of sub-pixel circuit units;
at least one gate line disposed between the plurality of sub-pixel circuit units and extending along a first direction;
at least one first data line group comprising a first pair of data lines disposed at both sides of the at least one quad-type pixel circuit unit and extending along a second direction;
at least one second data line group comprising a second pair of data lines disposed between the sub-pixel circuit units and extending along the second direction; and
at least one common line and at least one anode line disposed between the first pair of data lines of the first data line group and disposed along the first direction, and
wherein the at least one gate line crosses with the at least one first data line group and the at least one second data line group.

2. The electro-luminescence display apparatus of claim 1, further comprising:
an overcoat insulation layer on the at least one quad-type pixel circuit unit and the at least one common line;
a pixel electrode on the overcoat insulation layer;
an electro-luminescence layer on the pixel electrode; and
a common electrode on the electro-luminescence layer,
wherein the common electrode is electrically connected to the at least one common line at an area where the electro-luminescence layer is not disposed.

3. The electro-luminescence display apparatus of claim 2, further comprising at least one of a common line contact unit and a common line welding unit configured to electrically connect the common electrode and the at least one common line.

4. The electro-luminescence display apparatus of claim 3, wherein the common line welding unit is configured such that the common electrode is welded to the at least one common line at an area where the electro-luminescence layer is removed by a laser.

5. The electro-luminescence display apparatus of claim 3, further comprising:
at least one auxiliary common line overlapping with the at least one common line, and separated from the at least one common line along the second direction at a crossing of the at least one common line and the at least one gate line, wherein the at least one auxiliary common line is electrically connected to the at least one common line, and the at least one auxiliary common line is electrically insulated from the at least one gate line.

6. The electro-luminescence display apparatus of claim 5, further comprising:
a light-shield capacitor electrode, wherein a material of the light-shield capacitor electrode is the same as a metallic material of the at least one auxiliary common line, and wherein the light-shield capacitor electrode is configured to shield a driving transistor of the at least one sub-pixel circuit unit from light; and
an insulation buffer layer between the at least one common line and the at least one auxiliary common line.

7. The electro-luminescence display apparatus of claim 5, wherein the at least one auxiliary common line is separated from the common line welding unit along the second direction, and is configured to not overlap with the common line welding unit.

8. The electro-luminescence display apparatus of claim 5, further comprising:
at least one auxiliary anode line overlapping with the at least one anode line, and separated from the at least one auxiliary anode line along the second direction at a crossing of the at least one anode line and the at least one gate line, and wherein the at least one auxiliary anode line is electrically connected to the at least one common line, and
wherein the insulation buffer layer is between the at least one anode line and the at least one auxiliary anode line.

9. The electro-luminescence display apparatus of claim 8, wherein both the at least one common line and the at least one anode line comprise a first metallic material, and
wherein both the at least one auxiliary common line and the at least one auxiliary anode line comprise a second metallic material, and
wherein the second metallic material is different from the first metallic material.

10. The electro-luminescence display apparatus of claim 8, wherein both the at least one common line and the at least one auxiliary anode line comprise a first metallic material, and
wherein both the at least one auxiliary common line and the at least one anode line comprise a second metallic material, and
wherein the second metallic material is different from the first metallic material.

11. The electro-luminescence display apparatus of claim 10, wherein the common line welding unit is configured such that the connect electrode is welded to the at least one common line at an area where the electro-luminescence layer is removed by a laser.

12. The electro-luminescence display apparatus of claim 10, wherein the common line contact unit comprises a structure having a reverse-tapered shape, an exposed electro-luminescence layer part overlapping with the connect electrode, and a common line contact unit contact-hole overlapping with the connect electrode.

13. The electro-luminescence display apparatus of claim 10, further comprising a pixel electrode common line configured to electrically connect a plurality of common lines,
wherein the pixel electrode common line is disposed between the pixel electrodes and extends along the first direction,
wherein the pixel electrode common line is directly in contact with the connect electrode, and
wherein the pixel electrode common line and the connect electrode comprise a same metallic material.

14. The electro-luminescence display apparatus of claim 3, further comprising a connect electrode disposed between the at least one common line and the common electrode, wherein the connect electrode is configured to electrically connect the at least one common line and the common electrode,
- wherein the connect electrode and the pixel electrode comprise a first metallic material, and
- wherein the connect electrode is configured to overlap with at least one of the common line contact unit and the common line welding unit.

15. The electro-luminescence display apparatus of claim 2, further comprising a common line contact unit and a common line welding unit,
- wherein the common line contact unit and the common line welding unit are alternatively disposed along the second direction.

16. The electro-luminescence display apparatus of claim 1, further comprising at least one functional line between the second pair of data lines of the second data line group.

17. An electro-luminescence display apparatus comprising:
- a plurality of sub-pixel circuit units arranged in a matrix form;
- at least one gate line disposed between the plurality of sub-pixel circuit units and extending along a first direction;
- a plurality of first data line groups and a plurality of second data line groups alternatively disposed between the plurality of sub-pixel circuit units and extending along a second direction;
- a plurality of common lines disposed within the first or the second data line groups and extending along the second direction; and
- a plurality of anode lines disposed within the first or the second data line groups and extending along the second direction,
- wherein the plurality of common lines and the plurality of anode lines are alternatively disposed between the plurality of sub-pixel circuit units.

18. The electro-luminescence display apparatus of claim 17, wherein the plurality of common lines is disposed within the plurality of the first data line groups and the plurality of anode lines is disposed within the plurality of the second data line groups.

19. The electro-luminescence display apparatus of claim 17, wherein the plurality of common lines is disposed within the plurality of the second data line groups and the plurality of anode lines is disposed within the plurality of the first data line groups.

20. The electro-luminescence display apparatus of claim 17, wherein both of the plurality of common lines and the plurality anode lines are disposed within the first or the second data line groups.

21. The electro-luminescence display apparatus of claim 17, wherein a space of the first data line groups and a space of the second data line groups are determined according to a width of a signal line disposed therein.

22. The electro-luminescence display apparatus of claim 21,
- wherein the width of the common line is wider than the width of the anode line, and
- wherein the space of the first or the second data line group containing the common line is larger than the space of the first or the second data line group containing the anode line.

23. The electro-luminescence display apparatus of claim 17, further comprising an auxiliary common line overlapping with the common line and an auxiliary anode line overlapping with the anode line.

24. The electro-luminescence display apparatus of claim 23,
- wherein one line among the common line and the auxiliary common line is formed of a solid signal line, and
- wherein another line among the common line and the auxiliary common line is formed of a plurality of island electrodes.

25. The electro-luminescence display apparatus of claim 17, further comprising:
- a plurality of sub-pixel electrodes electrically connected to the plurality of sub-pixel circuit units; and
- a plurality of pixel electrode common lines configured to electrically interconnect the plurality of the common lines and extending along the first direction,
- wherein the plurality of sub-pixel electrodes are in a shape having a wider width along the second direction than the first direction, and
- wherein the plurality of sub-pixel electrode and the plurality of pixel electrode common lines are alternatively disposed along the second direction.

26. An apparatus comprising:
- an array of pixels, each pixel having four sub-pixels configured for a top-emission electro-luminescence display apparatus, each sub-pixel having a sub-pixel electrode and a sub-pixel circuit unit connected to said sub-pixel electrode, such that each pixel has four sub-pixel circuit units;
- said four sub-pixel circuit units arranged in a 2×2 matrix having first and second sub-pixel circuit units forming an upper pair and third and fourth sub-pixel circuit units forming an lower pair;
- a gate line passing between said upper and lower pairs of sub-pixel circuit units in the row direction and electrically connected to said four sub-pixel circuit units, respectively;
- a first data line passing along said first and fourth sub-pixel circuit units in the column direction and electrically connected to said first sub-pixel circuit unit;
- a second data line passing along said second and third sub-pixel circuit units in the column direction and electrically connected to said second sub-pixel circuit unit; and
- third and fourth data lines passing between said first and second sub-pixel circuit units and between said third and fourth sub-pixel circuit units in the column direction and electrically connected to said third and fourth sub-pixel circuit unit, respectively.

27. The apparatus of claim 26, further comprising:
- an anode line passing between adjacent sub-pixel circuit units in the column direction; and
- an extension unit extending in the row direction and electrically interconnecting said anode line to third and fourth sub-pixel circuit units of one pixel and to first and second circuit units of a different pixel adjacent to said one pixel in the column direction.

28. The apparatus of claim 26, further comprising at least one signal line extending along the column direction, and interposed in a first region between a first data line of one pixel and a second data line of different pixel adjacent to said one pixel in the row direction, interposed in a second region between third and fourth data lines of one pixel, or interposed in both said first and second regions.

29. The apparatus of claim 28, wherein said at least one signal line is at least one among a common line, an anode line, a reference voltage line, a touch sensing line, an external compensation line, a discharge line and an initial line.

30. The apparatus of claim 29, wherein said first regions of said array of pixels have said common line or said anode line in alternating manner.

31. The apparatus of claim 29, wherein said first region has said common line and said second region has said anode line.

32. An electro-luminescence display apparatus comprising:
- a pixel circuit unit comprising a plurality of quad-type sub-pixel circuit units;
- a gate line disposed between the plurality of sub-pixel circuit units and extending along a first direction;
- a first data line group comprising a first pair of data lines disposed at both sides of the pixel circuit unit and extending along a second direction;
- a second data line group comprising a second pair of data lines disposed between the sub-pixel circuit units and extending along the second direction;
- a pixel electrode on the overcoat insulation layer;
- a common line and an anode line disposed between the first pair of data lines of the first data line group and disposed along the first direction;
- an overcoat insulation layer on the at least one pixel circuit unit and the at least one common line; and,
- a pixel electrode common line disposed between a plurality of pixel electrodes and extending along the first direction, wherein the pixel electrode common line electrically connects a plurality of common lines, and wherein the gate line crosses with the first data line group and the second data line group.

33. The electro-luminescence display apparatus of claim 32, further comprising a connect electrode disposed between the common line and the common electrode, and wherein the pixel electrode common line is directly in contact with the connect electrode.

34. The electro-luminescence display apparatus of claim 33, wherein the pixel electrode common line comprises the same material as the connect electrode.

35. The electro-luminescence display apparatus of claim 32, wherein the pixel electrode common line comprises the same material as the pixel electrode.

36. The electro-luminescence display apparatus of claim 32, further comprising an auxiliary common line and an auxiliary anode line.

* * * * *